(12) United States Patent
Wang et al.

(10) Patent No.: US 6,607,825 B1
(45) Date of Patent: *Aug. 19, 2003

(54) METAL FILM BONDED BODY, BONDING AGENT LAYER AND BONDING AGENT

(75) Inventors: Dong Dong Wang, Gifu (JP); Motoo Asai, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/894,376

(22) PCT Filed: Dec. 26, 1995

(86) PCT No.: PCT/JP95/02698

§ 371 (c)(1),
(2), (4) Date: Aug. 22, 1997

(87) PCT Pub. No.: WO97/24229

PCT Pub. Date: Jul. 10, 1997

(51) Int. Cl.[7] .............................. B32B 7/12; B32B 15/16
(52) U.S. Cl. ..................... 428/343; 428/344; 428/234; 428/323; 428/328; 428/355 EN; 428/355 EP; 442/363; 523/427; 174/259
(58) Field of Search ................. 428/343, 344, 428/328, 355 EN, 355 EP, 323, 234; 523/427; 442/363; 174/259

(56) References Cited

U.S. PATENT DOCUMENTS

| | | | | |
|---|---|---|---|---|
| 4,216,246 A | 8/1980 | Iwasaki et al. | ............ | 427/510 |
| 4,752,499 A | 6/1988 | Enomoto | ............ | 427/98 |
| 5,021,472 A | 6/1991 | Enomoto | ............ | 523/427 |
| 5,055,321 A | 10/1991 | Enomoto et al. | ............ | 427/98 |
| 5,519,177 A | 5/1996 | Wang et al. | ............ | 174/259 |

FOREIGN PATENT DOCUMENTS

| | | |
|---|---|---|
| DE | 1640635 | 12/1970 |
| EP | 0612812 | 8/1994 |
| EP | 0625537 | 11/1994 |
| JP | 53140344 | 12/1978 |
| JP | 5844709 | 10/1983 |
| JP | 61-34085 | 2/1986 |
| JP | 61276875 | 12/1986 |
| JP | 1301775 | 12/1989 |
| JP | 2106340 | 4/1990 |
| JP | 461193 | 2/1992 |
| JP | 4-325590 | 11/1992 |
| JP | 5-25650 | 2/1993 |
| JP | 5-29761 | 2/1993 |
| JP | 5-214548 | 8/1993 |
| JP | 5-506691 | 9/1993 |

OTHER PUBLICATIONS

English Language Abstract of JP 5–25650.
English Language Abstract of JP 5–29761.
English Language Abstract of JP 4–325590.
English Language Abstract of WO 91/18957.
English Language Abstract of JP 61–34085.
English Language Abstract of JP 5–214548.
Patent Abstracts of Japan, vol. 15, No. 76 (C–809) Feb. 21, 1991. JP–02–301569 Eng ab.
Patent Abstracts of Japan, vol. 16, No. 249 (C–0948) Jun. 8, 1992. JP–04–056797 Eng ab.
Yamanaka et al., Polymer, 1989, vol. 30, Apr. 1989, pp. 662–667, "Structure Development in Epoxy Resin Modified With Poly(ether sulphone).".
An English Language Abstract of JP 1–301775.
An English Language Abstract of JP 53–140344.
An English Language Abstract of JP 61–276875.
An English Language Abstract of JP 2–106340.
An English Language Abstract of JP 4–61193.
An International Search Report issued with International Application No. PCT/P95/02698.

Primary Examiner—Terrel Morris
Assistant Examiner—John J. Guarriello
(74) Attorney, Agent, or Firm—Greenblum & Bernstein, P.L.C.

(57) ABSTRACT

As a technique capable of stably providing various metal film adhered bodies for printed circuit boards having an excellent peel strength even in the wiring having higher density and higher pattern accuracy and other industrial parts, there are provided adhesive, adhesive layer and metal film adhered body in which a mixed resin consisting of a thermoplastic resin and an uncured thermosetting resin including a resin substituted at a part of its functional group with a photosensitive group and/or an uncured photosensitive resin is used as a heat-resistant resin matrix constituting the adhesive and further a cured homogeneous resin composite forming a quasi-homogeneous compatible structure, co-continuous phase structure or spherical domain structure is used as a heat-resistant resin matrix of the adhesive layer.

11 Claims, 11 Drawing Sheets

(a)

(b)

(c)

(d)

(e)

(f)

0.1 μm

1 μm

10 μm

10 μm

10 μm

10μm

5μm

METAL FILM BONDED BODY, BONDING AGENT LAYER AND BONDING AGENT

BACKGROUND OF THE INVENTION

1. Field of the Invention

This invention relates to a metal film coated body, an adhesive layer and an adhesive, and more particularly proposes an adhesive and an adhesive layer having an excellent toughness without lowering heat resistance, electric insulation property and chemical stability and various metal film coated bodies having an excellent adhesion property between a substrate and a coated metal.

2. Description of Background Information

Recently, printed circuit boards and printed wiring substrates mounting LSI are required to have high densification and high reliability through fine pattern corresponding to miniaturization and high-speed performance of electron equipments with the advance of electron industry.

As a method of forming the conductor onto the printed wiring substrate, there is recently noticed an additive method wherein an adhesive is applied onto a surface of a substrate to form an adhesive layer and thereafter the surface of the substrate is roughened and subjected to an electroless plating.

According to this method, the conductor is formed by electroless plating after the formation of a resist, so that it has a merit that conductor wiring having high density and pattern accuracy can be produced with a low cost as compared with an etched foil method conducting the formation of pattern through etching (subtractive method).

In the additive method, there have hitherto been known a method in which fine unevenness is formed on the conductor-forming surface side of the adhesive layer through a chemical etching as a means for improving the adhesion property between conductor and adhesive layer (hereinafter explained a "peel strength").

In recent additive type printed circuit board requiring the formation of wiring with high density and pattern accuracy, however, it is required to make smaller anchor formed by surface roughening of the adhesive layer in order to precisely form the fine pattern of the resist. Therefore, as the anchor becomes small, the breaking area is small, so that there is caused a problem that the peel strength considerably lowers.

On the other hand, metallic parts are recently replaced with resin parts by the improvement of engineering plastics in automobile and transportation equipment related fields, electrical and electron parts and machine related fields, household article related field, civil engineering field and medical field.

For instance, there are mentioned housing and fixed ring of a camera using polycarbonate, bearing made from polyacetal and the like. Further, gear or the like made from super-high molecular weight polyethylene is developed.

In these resin parts, however, it might be required to cover the surface of the part with a metal film from viewpoints of design, corrosion resistance, wear resistance and the like.

As means for covering the resin surface with the metal film, there has hitherto been proposed a method in which an adhesive layer is formed on the surface of the resin substrate and the surface of the adhesive layer is roughened and coated with the metal film.

For example, JP-B-58-44709 discloses a method wherein an adhesive for electroless plating consisting of acrylonitrile butadiene rubber and epoxy resin is applied onto a surface of an insulative substrate and then the epoxy resin portion on the surface of the adhesive layer is dissolved and removed to roughen the surface and thereafter electroless plating is conducted to form a metal film coating.

Further, JP-A-61-276875 discloses a method wherein an adhesive for electroless plating obtained by dispersing fine powder of heat-resistant resin into heat-resistant resin matrix is applied onto the substrate and then the surface thereof is roughened by treating the fine powder of the heat-resistant resin with an oxidizing agent and thereafter the electroless plating is conducted.

In the engineering plastic (substrate resin) coated with the metal film through the adhesive layer, however, there were observed problems that cracks are caused due to the difference in thermal expansion coefficient between the substrate resin and the adhesive layer in heat cycle and that cracks are created in the adhesive layer itself at the time of generating stress.

In order to solve these problems, there is a method of increasing the strength of the coating metal or the heat-resistant resin matrix constituting the adhesive. According to the inventors' experiments, however, it has been confirmed that the peeling of the electroless plated film constituting the coating metal is created by the breakage of the heat-resistant resin matrix in the conventional technique using copper as the coating metal and the thermosetting resin or photosensitive resin as the heat-resistant resin matrix constituting the adhesive. That is, it has been noticed that the strength of the heat-resistant resin matrix constituting the adhesive is lacking as a cause of lowering the bonding strength. Further, it has been confirmed that the cause of cracking in the heat cycle or in the generation of stress is also the poor strength of the heat-resistant resin matrix.

In order to solve the aforementioned various problems in the conventional technique, therefore, it is an object of the invention to strengthen the heat-resistant resin matrix constituting the adhesive without lowering the heat resistance, electric insulation property and chemical stability.

It is another object of the invention to provide an adhesive layer having an excellent adhesion property to the coating metal.

It is the other object of the invention to establish the technique capable of stably providing various metal film coatings for printed circuit board having an improved peel strength even in wirings having high density and high pattern accuracy and other industrial parts.

SUMMARY OF THE INVENTION

The inventors have made various studies with respect to the improvement of the strength in the heat-resistant resin matrix constituting the adhesive in order to attain the above objects. As a result, it has been found that a mixed resin of an uncured thermosetting resin containing a resin substituted at a part of its functional group with a photosensitive group and/or an uncured photosensitive resin and a thermoplastic resin is used as a heat-resistant resin matrix constituting the adhesive and a resin composite obtained by curing this resin is used as an adhesive layer, whereby a metal film coated body such as printed wiring substrate or the like having an excellent adhesion strength to conductor metal can be provided even if anchor depth formed by roughening treatment is small, and the invention has been accomplished.

That is, (1) The adhesive according to the invention is an adhesive obtained by dispersing a dissolution-removable or decomposition-removable particulate substance into an uncured heat-resistant resin matrix, in which the heat-resistant resin matrix is a compatibility-adjusted resin mixture consisting of a thermoplastic resin and at least one or two resins selected from an uncured thermosetting resin containing a resin substituted at a part of its functional group with a photosensitive group (hereinafter referred to as uncured thermosetting resin simply) and an uncured photosensitive resin. This resin mixture is preferable to be compatible state by dissolving in a solvent or incompatible state. The word "compatible" as used herein refers to two or more components being miscible with each other.

When the resin mixture is at the compatible state, quasi-homogeneous compatible structure, co-continuous phase structure or spherical domain structure as mentioned later can be obtained by adjusting phase-separation rate and curing rate in the curing of the mixture.

When the resin mixture is at the incompatible state, spherical domain structure can be obtained by curing the mixture as it is.

As the dissolution-removable particulate substance, it is desirable to use at least one particle selected from inorganic particles, metal particles, elastomer particles, alkali-soluble resin particles and solvent-soluble resin particles.

As the decomposition-removable particulate substance, it is desirable to use a suspension-polymerized low crosslinking amino resin or the like.

In the invention, the term "dissolution-removal" means that the dissolution and decomposition of the particulate substance are caused by chemical action using a roughening solution such as acid, alkali, oxidizing agent, water, organic solvent or the like, while the term "decomposition-removal" means that the decomposition of the particulate substance is caused by heating, pressurizing, or atmosphere adjustment such as humidity adjustment or the like without using the roughening solution.

Furthermore, the "resin mixture of the thermoplastic resin and at least one or two resins selected from thermosetting resins and photosensitive resins" used in the invention means ① a resin mixture of thermosetting resin and thermoplastic resin, ② a resin mixture of photosensitive resin and thermoplastic resin, or ③ a resin mixture of thermosetting resin, photosensitive resin and thermoplastic resin.

Another adhesive according to the invention is an adhesive obtained by dispersing into an uncured heat-resistant resin matrix a resin solution not compatible with the matrix before curing and dissolution removable after curing, characterized in that the heat-resistant resin matrix is a compatibility-adjusted resin mixture of a thermoplastic resin and at least one or two resins selected from uncured thermosetting resins and uncured photosensitive resins.

The other adhesive according to the invention is an adhesive obtained by mixing an uncured heat-resistant resin matrix with a resin solution compatible with the matrix before curing and dissolution removable by phase separation after curing, characterized in that the heat-resistant matrix is a compatibility-adjusted resin mixture of a thermoplastic resin and at least one or two resins selected from uncured thermosetting resins and uncured photosensitive resins.

When such a resin mixture is at the compatible state, quasi-homogeneous compatible structure, co-continuous phase structure or spherical domain structure as mentioned later can be obtained by adjusting phase-separation rate and curing rate in the curing of the mixture.

When the resin mixture is at the incompatible state, spherical domain structure can be obtained by curing the mixture as it is.

(2) The adhesive layer according to the invention is an adhesive layer formed on a substrate and having a roughened surface, characterized in that said layer is formed by dispersing a dissolution-removable or decomposition-removable granular substance into a cured heat-resistant resin matrix being a resin composite consisting of a thermoplastic resin and at least one or two resins selected from a thermosetting resin containing a resin substituted at a part of its functional group with a photosensitive group (hereinafter referred to as uncured thermosetting resin simply) and an uncured photosensitive resin. This resin composite is preferable to form a quasi-homogeneous compatible structure, co-continuous phase structure or spherical domain structure.

As the dissolution-removable particulate substance, it is desirable to use at least one particle selected from inorganic particles, metal particles, elastomer particles, alkali-soluble resin particles and solvent-soluble resin particles.

As the decomposition-removable particulate substance, it is desirable to use a suspension-polymerized low crosslinking amino resin or the like.

The other adhesive layer according to the invention is an adhesive layer formed on a substrate and having a roughened surface, characterized in that said layer is formed by dispersing a dissolution-removable resin into a cured heat-resistant resin matrix being a resin composite consisting of a thermoplastic resin and at least one or two resins selected from a thermosetting resin and a photosensitive resin in form of lands to form a sea-land structure. This resin composite is preferable to form a quasi-homogeneous compatible structure, co-continuous phase structure or spherical domain structure.

As the dissolution-removable resin, it is desirable to use a resin not compatible with the uncured heat-resistant resin matrix before the curing and forming "sea-land structure" with this resin matrix at inhomogeneous state after the curing, and a resin compatible with the uncured heat-resistant resin matrix before the curing, causing phase separation from this resin matrix during the curing and forming "sea-land structure" with the resin matrix at inhomogeneous state after the curing.

The phase separation during the curing includes ①. phase separation created by the curing of the matrix resin, ②. phase separation created by the curing of both the matrix and the dissolution removable resin, and ③. phase separation created by heat (temperature) added in the curing and fixation of phase by the curing.

Moreover, the term "sea-land structure" used in the invention means that the heat-resistant resin matrix forms a sea and high concentration portions of the dissolution-removable resin are existent in the sea at an inhomogeneous concentration state in form of lands, in which the boundary between sea and land is unclear. These lands may be separated from each other in the sea, or some of lands may be continuous.

In such an adhesive layer, the roughened surface is formed by dissolving or decomposing off the dissolution-removable or decomposition-removable particulate substance or the dissolution-removable resin with land structure from the surface of the adhesive layer.

As the substrate, use may be made of printed circuit board provided with conductor circuit and industrially applicable ones of various shapes such as fiber-shaped, rod-shaped, spherical-shaped and the like.

(3) The metal film adhered body according to the invention comprises a substrate, an adhesive layer having a roughened surface at its side to be coated with a metal, and a metal film arranged on the roughened surface of the adhesive layer, characterized in that the adhesive layer is formed by dispersing a dissolution-removable or decomposition-removable particulate substance into a cured heat-resistant resin matrix being a resin composite consisting of a thermoplastic resin and at least one or two resins selected from a thermosetting resin containing a resin substituted at a part of its functional group with a photosensitive group (hereinafter referred to as uncured thermosetting resin simply) and an uncured photosensitive resin. This resin composite is preferable to form a quasi-homogeneous compatible structure, co-continuous phase structure or spherical domain structure.

As the dissolution-removable particulate substance, it is desirable to use at least one particle selected from inorganic particles, metal particles, elastomer particles, alkali-soluble resin particles and solvent-soluble resin particles.

As the decomposition-removable particulate substance, it is desirable to use a suspension-polymerized low crosslinking amino resin or the like.

The other metal film coated body according to the invention comprises a substrate, an adhesive layer having a roughened surface at its side to be coated with a metal, and a metal film arranged on the roughened surface of the adhesive layer, characterized in that the adhesive layer is formed by dispersing a dissolution-removable resin into a cured heat-resistant resin matrix being a resin composite consisting of a thermoplastic resin and at least one or two resins selected from a thermosetting resin and a photosensitive resin in form of lands to form a sea-land structure. This resin composite is preferable to form a quasi-homogeneous compatible structure, co-continuous phase structure or spherical domain structure.

As the dissolution-removable resin, it is desirable to use a resin not compatible with the uncured heat resistant resin matrix before the curing and forming "sea-land structure" with this resin matrix at inhomogeneous state after the curing, and a resin compatible with the uncured heat-resistant resin matrix before the curing, causing phase separation from this resin matrix during the curing and forming "sea-land structure" with the resin matrix at inhomogeneous state after the curing.

As the substrate, use may be made of printed circuit board provided with conductor circuit and industrially applicable ones of various shapes such as fiber-shaped, rod-shaped, spherical-shaped and the like.

In the metal film coated body according to the invention, the board is used as a substrate and a coated metal is etched, if necessary, or a metal is coated in form of pattern to form a printed circuit board.

Such a printed circuit board is a printed circuit board wherein an adhesive layer formed by dispersing the dissolution-removable or decomposition-removable particulate substance into the cured heat-resistant resin matrix is, for example, formed on the substrate and the roughened surface is formed on the surface of the adhesive layer to be provided with the conductor and further the conductor circuit is arranged on the roughened surface, characterized in that the heat-resistant resin matrix is a resin composite consisting of a thermoplastic resin and at least one or two resins selected from thermosetting resin and photosensitive resin. The resin composite is preferable to form a quasi-homogeneous compatible structure, co-continuous phase structure or spherical domain structure.

The other printed circuit board comprises a substrate, an adhesive layer formed thereon by dispersing lands of a dissolution-removable resin into a sea of a cured heat-resistant resin matrix consisting of a resin composite of a thermoplastic resin and at least one or two resins selected from thermosetting resin and photosensitive resin to form a sea-land structure and provided with a conductor-forming roughened surface and a conductor circuit arranged on the roughened surface, characterized in that the heat-resistant resin matrix is a resin composite of a thermoplastic resin and a thermosetting resin and/or a photosensitive resin. The resin composite is preferable to form a quasi-homogeneous compatible structure, co-continuous phase structure or spherical domain structure.

Figure 1:
FIGS. 1(a) to (f) is a flow sheet illustrating the production steps of an embodiment of the printed circuit board according to the invention.
Figure 1:
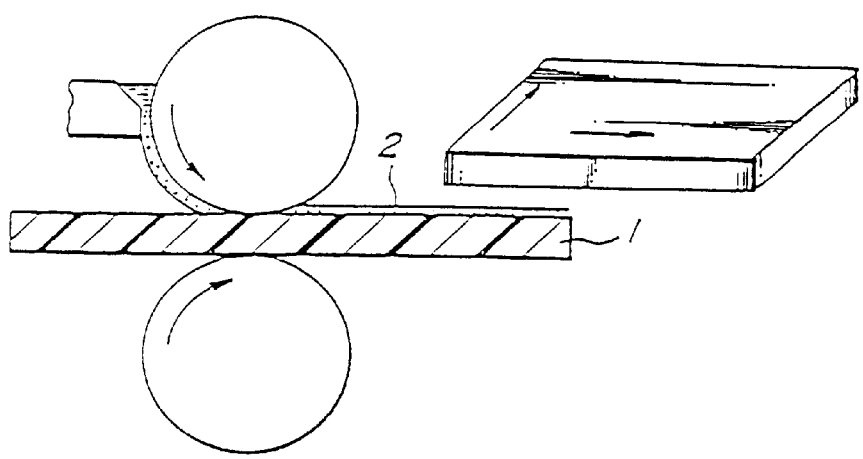
Figure 1:
Figure 1:
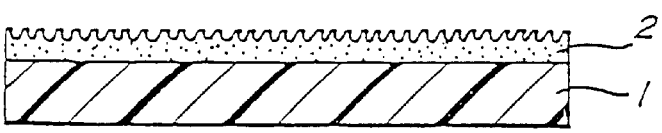
Figure 1:
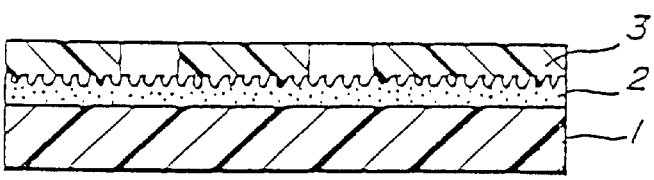
Figure 1:
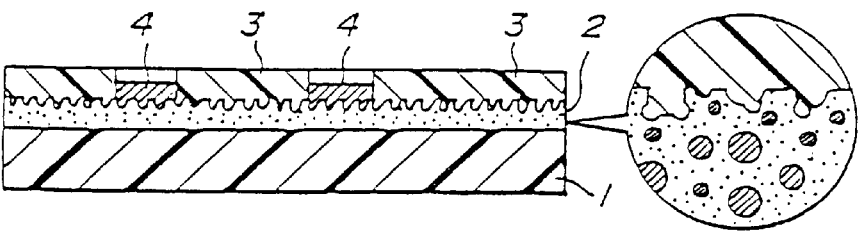

In these figures, numeral 1 is a substrate, numeral 2 an adhesive layer, numeral 3 a resist, numerals 4, 6, 8 and 10 conductors, and numeral 5 a viahole.

DETAILED DESCRIPTION OF PREFERRED EMBODIMENTS OF THE INVENTION (1) An essential feature in the adhesive according to the invention lies in a point that the adhesive matrix is a mixture of "an uncured thermosetting resin inclusive of a resin substituted at a part of its functional group with a photosensitive group (hereinafter referred to as uncured thermosetting resin simply) and/or an uncured photosensitive resin" and "a thermoplastic resin". Particularly, in the adhesive according to the invention, it is desirable that the resin mixture of the thermoplastic resin and at least one or two resins selected from the uncured thermosetting resin and the uncured photosensitive resin is homogeneously mixed at the compatible state. Thus, the resin matrix of the adhesive can be strengthened without lowering the heat resistance, electrical insulation property and chemical stability.

The reason why the resin mixture of the compatible state is used as the heat-resistant resin matrix of the adhesive is due to the fact that the resin structure of the resin composite consisting of the thermoplastic resin and at least one or two resins selected from the cured thermosetting resin and photosensitive resin can easily be controlled by the curing conditions.

As the method of homogeneously mixing and dispersing at least one or two resins selected from the uncured thermosetting resin and the uncured photosensitive resin with the thermoplastic resin at the compatible state, there are a method of dissolving these resins in a solvent, a method of fusing the thermoplastic resin by heating and mixing with the thermosetting resin or photosensitive resin and the like. Particularly, the method of dissolving the resins in the solvent is preferably used because the resins can compatibly be dissolved at a low temperature with a good operability.

As the solvent, mention may be made of dimethylformamide (DMF), normal methylpyrolidone (NMP), methylene chloride, diethylene glycol dimethyl ether (DMDG) and the like.

In the adhesive according to the invention, it is desirable that the compounding ratio of at least one or two resins selected from the uncured thermosetting resin and the uncured photosensitive resin to the thermoplastic resin in the heat-resistant resin matrix is 15–50 wt % as a content of thermoplastic resin.

When the content of the thermoplastic resin is less than 15 wt %, the toughness of the adhesive layer can not be improved, while when it exceeds 50 wt %, it is difficult to apply the adhesive and to form a smooth and uniform adhesive layer.

The viscosity of the adhesive according to the invention is desirable to be 0.5–10 Pa·s measured at 25° C. When the viscosity exceeds 10 Pa·s, the leveling property is decreased and the smooth adhesion surface can not be obtained, while when it is less than 0.5 Pa·s, the settlement of the dissolution-removable or decomposition-removable particulate substance is caused and the sufficient roughened surface can not be obtained and the adhesion property to the coated metal lowers.

(2) An essential feature in the adhesive layer according to the invention lies in a point that a resin composite of a thermoplastic resin and at least one or two resins selected from a thermosetting resin inclusive of a resin substituted at a part of its functional group with a photosensitive group (hereinafter referred to as uncured thermosetting resin simply) and a photosensitive resin is used as a resin matrix of the adhesive layer. Thus, the adhesive layer having an excellent adhesion property to the coated metal can stably be provided.

The reason why the resin composite of the thermoplastic resin and at least one or two resins selected from the thermosetting resin and the photosensitive resin is used as the heat-resistant resin matrix of the adhesive layer is due to the fact that the resin composite can develop the properties inherent to the thermosetting resin or photosensitive resin and the toughness inherent to the thermoplastic resin and hence the whole of the resin matrix can be strengthened without lowering the heat resistance, elasticity, electrical insulation property and chemical stability.

The surface of the adhesive layer according to the invention is roughened, but the roughened surface is formed by so-called octopus trap-like recess portions capable of dissolving or decomposing the dissolution-removable or decomposition-removable particulate substance, or land-dispersed dissolution-removable resin. Therefore, these recess portions form anchors for metal coating precipitated by electroless plating or the like, and the resin matrix constituting the recess portion is large in the toughness and hardly causes the resin breakage, so that the adhesion strength (peel strength) can highly be maintained without peeling off the metal coating from the roughened surface of the adhesive layer.

Furthermore, the heat-resistant resin matrix is excellent in the toughness, so that it hardly breaks even if the adhesive layer itself is subjected to deformation and can be used even if the substrate is subjected to deformation or stress.

In the adhesive layer according to the invention, the resin composite is desirable to form a quasi-homogeneous compatible structure, co-continuous phase structure or spherical domain structure. Here, (a) the term "quasi-homogeneous compatible structure" means a state that in the resin composite of the thermosetting resin or photosensitive resin and the thermoplastic resin exhibiting so-called LCST (Low Critical Solution Temperature) type phase diagram, the particle size of the constituting resin particles is not more than 0.1 $\mu$m as measured by means of a transmission type electron microscope and the peak value of the glass transition temperature of the resin as measured by dynamic viscoelasticity is one. Such a state is close to an ideal mixed state of the resin and is a new concept uniquely though by the inventors. The conditions for the measurement of dynamic viscoelasticity are a vibration frequency of 6.28 rad/sec and a temperature rising rate of 5° C./min.

That is, the quasi-homogeneous compatible structure is a more homogeneous structure exhibiting an effect of introducing properties higher than that inherent to the thermoplastic resin such as polyether sulfon (PES) or the like while maintaining the properties inherent to the thermosetting resin such as epoxy resin or the photosensitive resin such as acrylic resin, and is very strong in the interaction between the thermosetting resin or photosensitive resin and the thermoplastic resin.

The structure of this resin composite is confirmed from a fact that the broken surface state of the resin composite is unchangeable and homogeneous even after the etching with a solvent dissolving the thermoplastic resin.

In the resin composite forming the quasi-homogeneous compatible structure, the breaking strength and the tensile strength are higher than those of each resin constituting the resin composite.

The effect by the structure of this resin composite is particularly conspicuous when the content of the thermoplastic resin (e.g. PES) in the resin composite is 15–50 wt % as a solid content. When the content of the thermoplastic resin is less than 15 wt %, the molecule of the thermoplastic resin entangling in a net of the resin component is less and the toughening effect is not sufficiently developed, while when it exceeds 50 wt %, the interaction between the thermoplastic resin and the thermosetting resin or photosensitive resin becomes small due to the decrease of the crosslinking point number.

The quasi-homogeneous compatible structure is formed by dissolving the uncured thermosetting resin or uncured photosensitive resin and the thermoplastic resin in a solvent, if necessary, and uniformly mixing them and then fastening the curing rate and/or delaying the phase separation rate so as to have a particle size of not more than 0.1 μm as measured by means of a transmission type electron microscope.

Concretely, as a first method, there is a method in which the curing is carried out at curing rate exceeding a quasi-homogeneous phase forming point determined by at least one factor selected from curing temperature of thermosetting resin, kind of curing agent and presence or absence of photosensitivity in case of using the thermosetting resin, or at a curing rate exceeding a quasi-homogeneous phase forming point determined by photocuring factors of photosensitive resin such as initiator, sensitizer, photosensitive monomer, exposure conditions and the like in case of using the photosensitive resin. The term "quasi-homogeneous phase forming point" used herein means a lower limit of the curing rate capable of obtaining such a quasi-homogeneous compatible structure that the particle size of the resin particle constituting the composite is not more than 0.1 μm as a value measured by TEM observation.

As a second method, there is a method in which the curing is carried out at a phase separation rate not exceeding a quasi-homogeneous phase forming point determined by at least one of functional group number per one molecule and molecular weight in the uncured thermosetting resin or uncured photosensitive resin. In this case, the quasi-homogeneous phase forming point means an upper limit of the phase separation rate capable of obtaining such a quasi-homogeneous compatible structure that the particle size of the resin particle constituting the composite is not more than 0.1 μm as a value measured by TEM observation.

As a third method, there is a method in which the curing is carried out at a curing rate exceeding the quasi-homogeneous phase forming point and at a phase separation phase not exceeding the quasi-homogeneous phase forming point. This means the case that the factors determining the curing rate and the phase separation rate influence with each other.

Then, the interrelation among the above factors determining the curing rate and the phase separation rate will be described. At first, the factor determining the curing rate is as follows when the other factors are constant:

① The Curing Rate Becomes Faster as the Curing Temperature of the Thermosetting Resin Is High Therefore, when the thermosetting resin is cured so as to exceed the lower limit of the curing temperature required for the provision of the curing rate exceeding the quasi-homogeneous phase forming point, the structure of the resulting resin composite is a quasi-homogeneous compatible structure.

② The Curing Rate Becomes Faster as the Gel Time Is Short

Therefore, when the thermosetting resin is cured by using a curing agent so as not to exceed the upper limit of the gel time required for the provision of the curing rate exceeding the quasi-homogeneous phase forming point, the structure of the resulting resin composite is a quasi-homogeneous compatible structure.

③ The Curing Rate Becomes Faster as the Photosensitivity Is Imparted

Therefore, when the photosensitivity is imparted to the resin in the combination of other factors forming the quasi-homogeneous compatible structure, the resulting resin composite is a more quasi-homogeneous compatible structure.

As a method of imparting the photosensitivity, there are a method of introducing a photosensitive group into the thermosetting resin or the thermoplastic resin and a method of compounding a photosensitive monomer, in which a photoinitiator and photosensitizer may be added, if necessary.

Moreover, a photosensitive resin such as acrylic resin or the like can be used instead of the thermosetting resin. In this case, it is necessary that the photosensitive resin should be cured at a curing rate exceeding the quasi-homogeneous phase forming point determined by photocuring factors such as initiator, sensitizer, photosensitive monomer, exposure conditions and the like.

Figure 10:
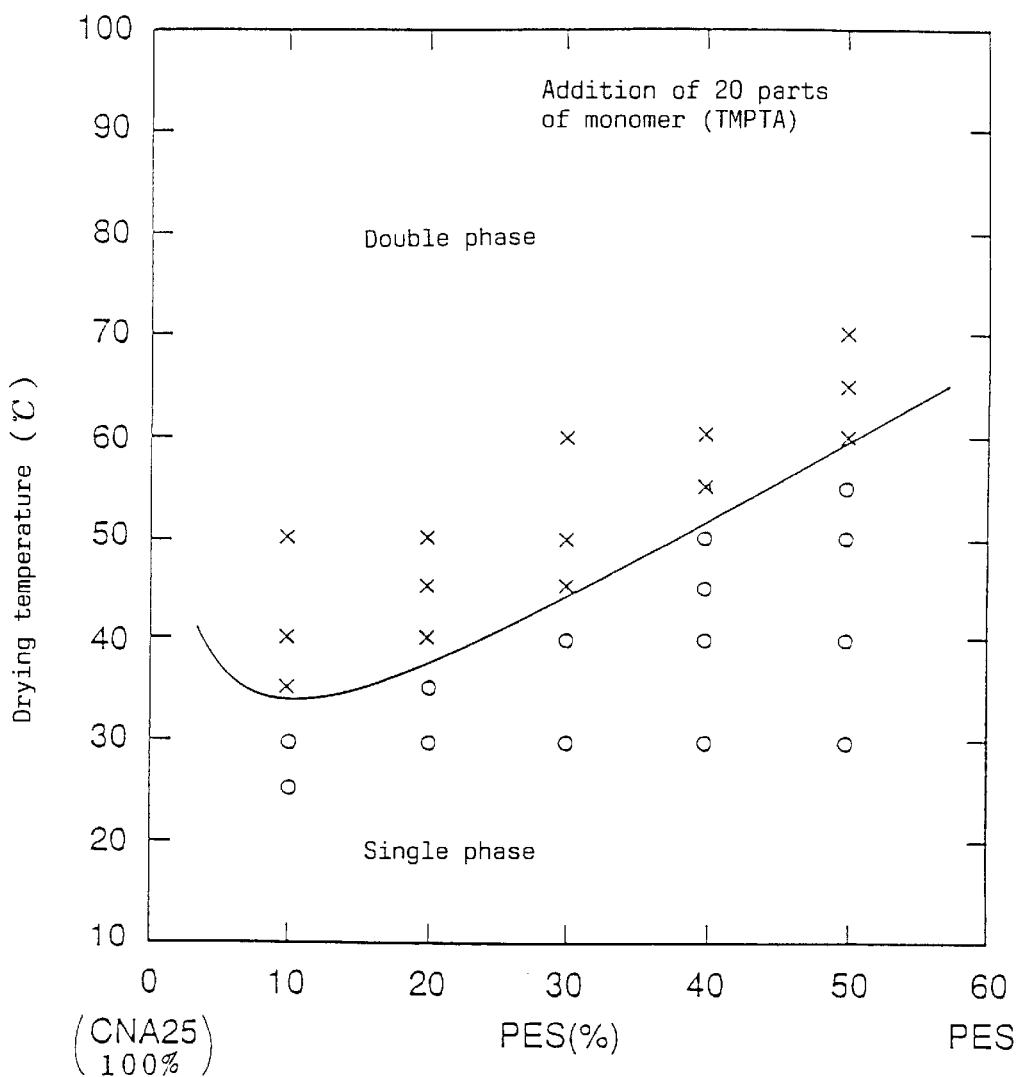
FIG. 10 is a phase diagram showing a relationship between drying temperature of CNA 25/PES/TMPTA mixture and state of resin composite after the curing.
Figure 11:
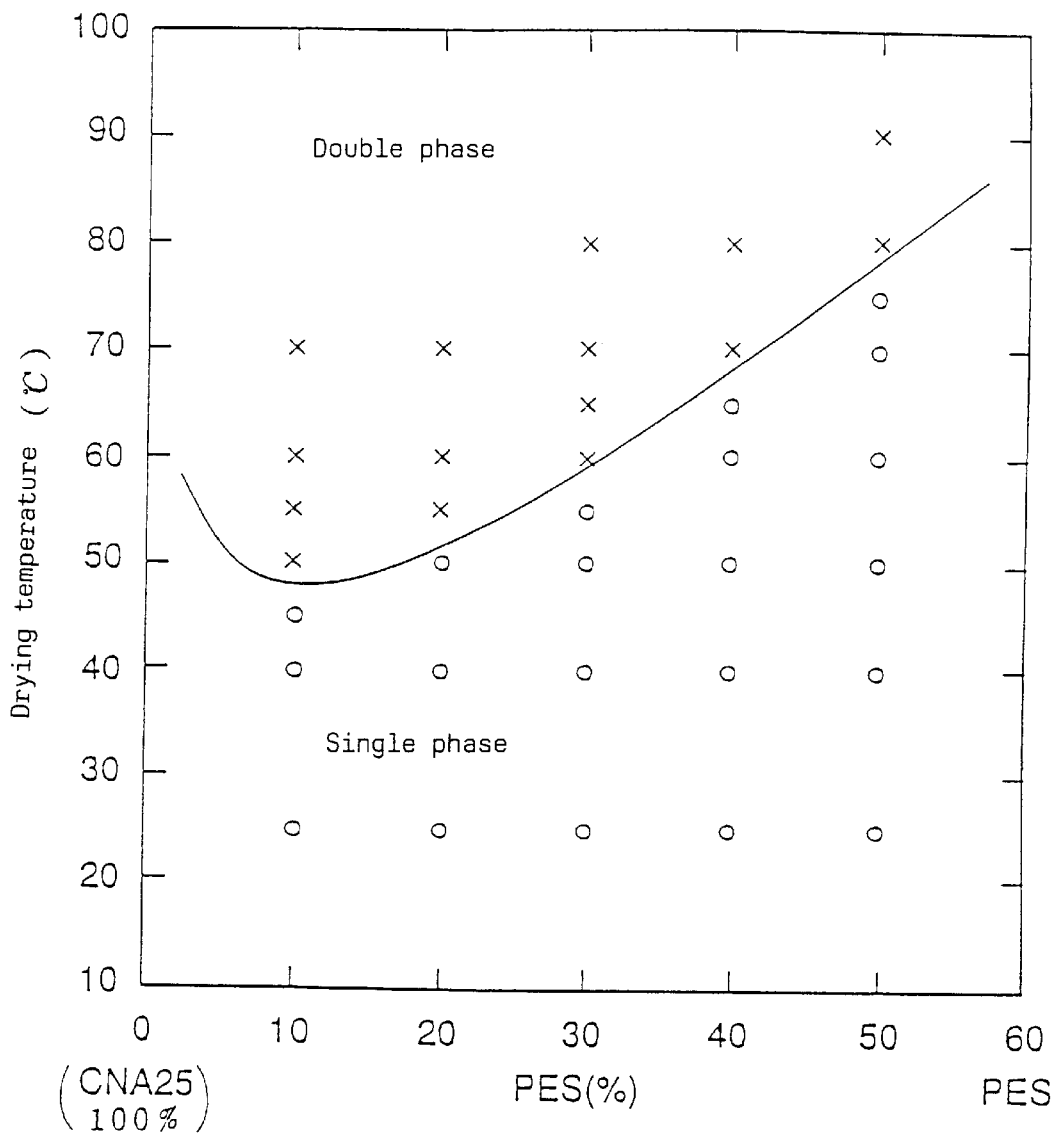
FIG. 11 is a phase diagram showing a relationship between drying temperature of CNA 25/PES mixture and state of resin composite after the curing.
Figure 12:
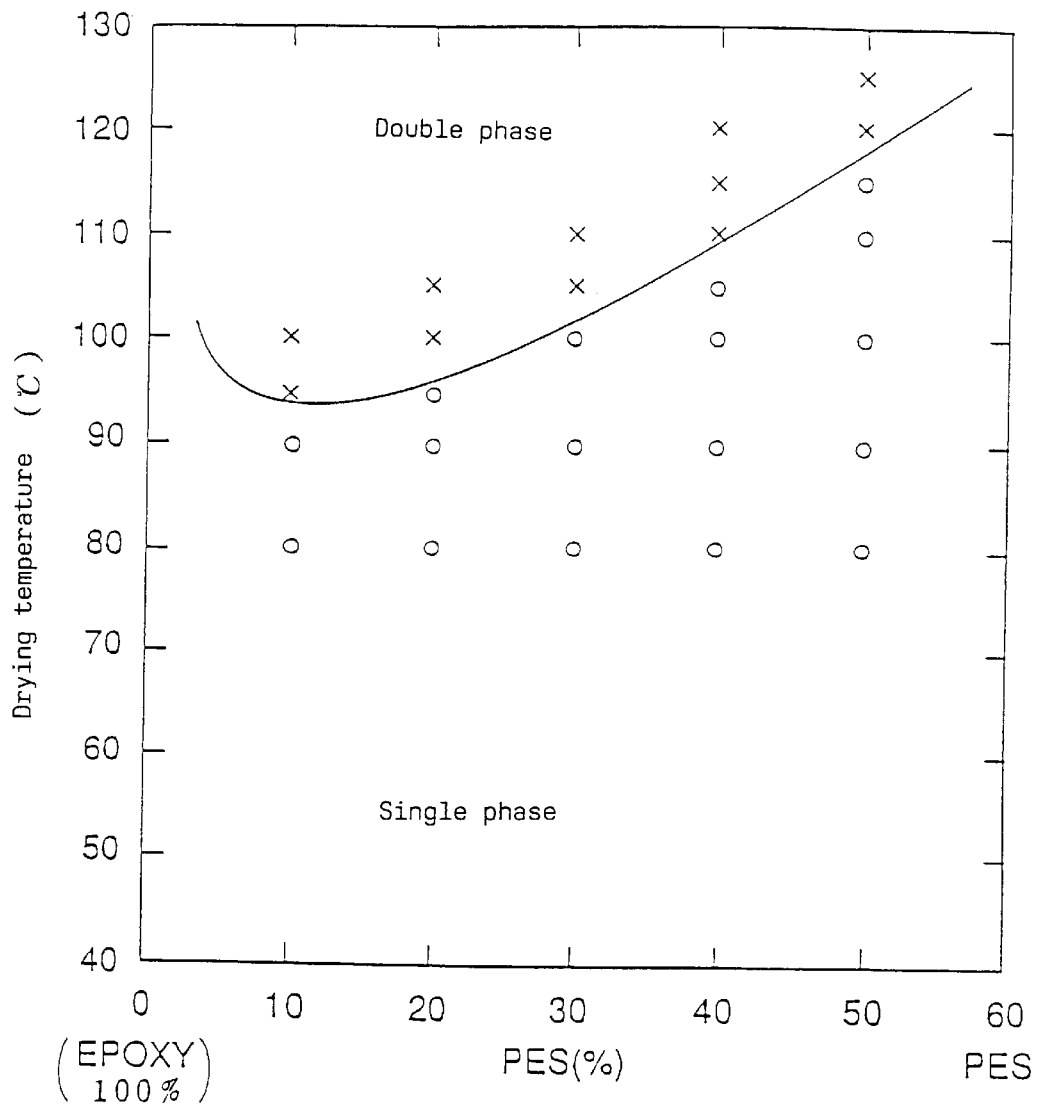
FIG. 12 is a phase diagram showing a relationship between drying temperature of epoxy/PES mixture and state of resin composite after the curing.

However, the photosensitivity is given to the thermosetting resin, or when the photosensitive monomer is used for improving the resolution in the development, the compatibility of the uncured thermosetting resin or the uncured photosensitive resin with the thermosetting resin lowers to cause phase separation at a relatively low temperature (see FIGS. 10–12). Therefore, when the photosensitivity is given to the thermosetting resin, or when the photosensitive monomer is used, the adhesive is dried at a low temperature (30–60° C.) and, if necessary, under vacuum and cured by exposure to light at once and then heat-cured (80–200° C.), whereby the quasi-homogeneous compatible structure can be obtained.

Considering the above facts, when the variable factor in the compositing between the thermosetting resin or photosensitive resin and the thermoplastic resin is one, the value of the factor corresponding to the quasi-homogeneous phase forming point is one point. If the factors are two or more, the value of the factor corresponding to the quasi-homogeneous phase forming point is considered to be various combinations. That is, the combination for the curing rate can be selected so as to satisfy that the particle size of the resin constituting the composite is not more than 0.1 μm as a value measured by TEM observation.

Next, the factor determining the phase separation rate is as follows when the other factors are constant:

① It is difficult to produce the phase separation as the functional group number per one molecule of the uncured thermosetting resin or uncured photosensitive resin becomes large (the phase separation rate becomes slow).

Therefore, when the curing is carried out by using the uncured thermosetting resin or uncured photosensitive resin with the functional group number per one molecule exceeding the lower limit of the functional group number required for the provision of the phase separation rate not exceeding the quasi-homogeneous phase forming point, the resulting resin composite has a quasi-homogeneous compatible structure.

② It is difficult to produce the phase separation as the molecular weight of the uncured thermosetting resin or uncured photosensitive resin becomes large (the phase separation rate becomes slow).

Therefore, when the curing is carried out by using the uncured thermosetting resin or uncured photosensitive resin with a molecular weight exceeding the lower limit of the molecular weight required for the provision of the phase separation rate not exceeding the quasi-homogeneous phase forming point, the resulting resin composite has a quasi-homogeneous compatible structure.

Considering the above facts, when the variable factor in the compositing between the thermosetting resin or photosensitive resin and the thermoplastic resin is one, the value of the factor corresponding to the quasi-homogeneous phase forming point is one point. If the factors are two, the value of the factor corresponding to the quasi-homogeneous phase forming point is considered to be various combinations. That is, the combination for the phase separation rate can be selected so as to satisfy that the particle size of the resin constituting the composite is not more than 0.1 $\mu$m as measured by TEM observation.

In the resin composite having such a quasi-homogeneous compatible structure, epoxy resin can be used as a thermosetting resin. In this case, the epoxy resin is desirable to have an epoxy equivalent of about 100–1,000. Because, it is difficult to produce the epoxy resin having an epoxy equivalent of less than 100, while when the epoxy equivalent exceeds 1,000, it is difficult to mix with the thermoplastic resin such as PES or the like and also the phase separation is caused by heating for the curing due to the lowering of Tg point to hardly provide the quasi-homogeneous compatible structure. The molecular weight of the epoxy resin is desirably 200–10000. When the molecular weight of the epoxy resin is less than 200, the sufficient reaction rate is not obtained and even if it is cured, the cured product becomes hard and brittle, while when the molecular weight of the epoxy resin exceeds 10000, the compatibility with the thermoplastic resin lowers.

Further, PES can be used as the thermoplastic resin. In this case, the molecular weight of PES is desirable to be 3000–100000. When the molecular weight of PES is less than 3000, the effect of improving the toughness through the quasi-homogeneous compatible structure is not obtained, while when it exceeds 100000, the compatible state with the thermosetting resin or photosensitive resin can not be formed.

As mentioned above, the resin composite exhibiting the quasi-homogeneous compatible structure possesses the properties inherent to the thermosetting resin such as epoxy resin or the like or the properties inherent to the photosensitive resin such as acrylic resin or the like and can exhibit properties higher than those inherent to the thermoplastic resin such as PES or the like. That is, PES-modified epoxy resin or PES-modified acrylic resin is high in the strength as compared with that of the PES resin alone and has the strengthening effect of the epoxy resin or the photosensitive resin, which has never been attained in the conventional technique.

(b) The term "co-continuous phase structure" means a composite structure in which spherical particles containing rich thermosetting resin such as epoxy resin or the like are continuously existent in the matrix containing rich thermoplastic resin such as PES or the like (written by Takashi INOUE et al., POLYMER, 30 p662(1989)).

Such a structure of the resin composite is confirmed from the fact that when the broken face of the resin composite is etched with a solvent dissolving the thermoplastic resin, the matrix portion of rich thermoplastic resin is dissolved to observe only the connected spherical particles of the epoxy resin or the like.

The resin composite forming the co-continuous phase structure is large in the toughness as compared with the thermosetting resin such as epoxy resin alone because the thermoplastic resin having an excellent toughness is existent in form of continuous phase.

(c) The term "spherical domain structure" means a state that spherical domains of thermosetting resin or photosensitive resin are separately and uniformly dispersed into the matrix of the thermoplastic resin.

Such a structure of the resin composite is confirmed from the fact that when the broken face of the resin composite is etched with a solvent dissolving the thermoplastic resin, the matrix portion of rich thermoplastic resin is dissolved to observe only the separately and uniformly dispersed spherical particles of the epoxy resin.

The resin composite forming such a spherical domain structure is more tough than the thermosetting resin alone because the spherical particles of the thermosetting resin are dispersed into a "sea" of the thermoplastic resin.

The effect by the co-continuous phase structure or spherical domain structure of the resin composite becomes particularly conspicuous when the content of the thermoplastic resin (e.g. PES) in the resin composite is 15–50 wt % as a solid content. When the content of the thermoplastic resin is less than 15 wt %, the molecule of the thermoplastic resin entangling in a net of the resin component is less and the toughening effect is not sufficiently developed, while when it exceeds 50 wt %, the interaction between the thermoplastic resin and the thermosetting or photosensitive resin becomes small due to the decrease of the crosslinking point number.

In the resin composite, the average particle size of the spherical particles constituting the co-continuous phase structure or spherical domain structure is desirable to be more than 0.1 $\mu$m but not more than 5 $\mu$m. When the average particle size of the spherical particle is not more than 0.1 $\mu$m, it is difficult to form the co-continuous phase structure or spherical domain structure, while when it exceeds 5 $\mu$m, the improvement of the toughness can not be attained and the photosensitivity and the heat resistance are degraded.

Moreover, the aforementioned co-continuous phase structure or spherical domain structure is formed by ① controlling the substitution ratio of functional group and photosensitive group contributing to the thermosetting of the thermosetting resin, or ② adjusting the kind and molecular weight of the photosensitive resin to mix the uncured thermosetting or photosensitive resin with the thermoplastic resin at a compatible or incompatible state and thereafter adjusting the drying or curing conditions so as to have an average particle size of the constituted spherical particles of more than 0.1 $\mu$m but not more than 5 $\mu$m.

And also, at least one or two resins selected from thermosetting resins and photosensitive resins are used as the resin matrix, and the thermoplastic resin may be used as a resin forming connected or independent spherical domains.

As mentioned above, the adhesive layer according to the invention is desirable to form the quasi-homogeneous compatible structure, co-continuous phase structure or spherical domain structure. Among them, the formation of the quasi-homogeneous compatible structure is high in the resin strength ass compared with the formation of the co-continuous phase structure or spherical domain structure, so that it is favorable to form the quasi-homogeneous compatible structure as the resin matrix for the adhesive layer.

Moreover, the thickness of the adhesive layer according to the invention is desirable to be 10–200 $\mu$m. When the thickness is less than 10 $\mu$m, the peel strength lowers, while when it exceeds 200 $\mu$m, the solvent in the adhesive is hardly removed and it is difficult to conduct the drying and curing.

(3) The metal film coated body according to the invention is a metal film coated body comprising a substrate, a roughened adhesive layer formed on the surface of the substrate, and a metal film arranged on the roughened surface of the adhesive layer and lies in a point that a heat-resistant resin matrix of the adhesive layer is a resin composite of a thermoplastic resin and at least one or two resins selected from thermosetting resin inclusive of a resin substituted at a part of its functional group with a photosensitive group (hereinafter referred to as "thermosetting resin" simply) and photosensitive resins.

In this case, the resin composite is desirable to form a quasi-homogeneous compatible structure, co-continuous phase structure or spherical domain structure.

The surface of the adhesive layer in the metal film coated body according to the invention is roughened, but the roughened surface is formed by so-called octopus trap-like recess portions capable of dissolving or decomposing the dissolution-removable or decomposition-removable particulate substance, or land-dispersed dissolution-removable resin. Therefore, these recess portions form anchors for metal coating precipitated by electroless plating or the like, and the resin matrix constituting the recess portion is large in the toughness and hardly causes the resin breakage, so that the adhesion strength (peel strength) can highly be maintained without peeling off the metal coating from the roughened surface of the adhesive layer.

In the metal film coated body according to the invention, a board is used as a substrate and a coating metal is etched in form of a pattern or covered thereon in form of pattern, whereby a printed circuit board can be produced. Moreover, such a printed circuit board may be multilayered.

In this case, the roughened surface is desirable to have Rmax=1–20 μm. When Rmax is less than 1 μm, the desired adhesion strength is not obtained, while when it exceeds 20 μm, it is difficult to produce printed circuit boards of fine pattern having a pattern pitch of not more than 100 μm.

According to such a printed circuit board, the heat-resistant resin matrix constituting the adhesive can be strengthened without lowering the heat resistance, elasticity, chemical stability and electrical insulation property, and hence the printed circuit board having an excellent peel strength even in the wiring having high density and pattern accuracy can stably be provided.

In the adhesive, adhesive layer and metal film coated body according to the invention as mentioned above, phenolic resins, amino resins such as melamine resin, urea resin or the like, epoxy resin, epoxy-modified polyimide resin, unsaturated polyester resin, polyimide resin, urethane resin, diallylphthalate resin and so on may be used as a thermosetting resin used in the heat-resistant resin matrix because these resins are excellent in the thermal and electrical properties. In the thermosetting resin, a part of functional groups contributing to the thermosetting may locally be substituted with a photosensitive group. For example, 5–70% acrylated epoxy resin is preferable.

As the thermoplastic resin used in the heat-resistant resin matrix, use may be made of polyether sulfon (PES), polysulfon (PSF), phenoxy resin, polyether imide (PEI), polystyrene, polyethylene, polyarylate, polyamidoimide, polyphenylene sulfide, polyether ether ketone, polyoxybenzoate, polyvinyl chloride, polyvinyl acetate, polyacetal, polycarbonate and the like. These thermoplastic resins are high in the heat resistance and toughness and can be made compatible with the thermosetting resin by using a solvent.

Among them, the epoxy resin and the polyether sulfon (PES) are favorable as the thermosetting resin and thermoplastic resin, respectively.

Because, the quasi-homogeneous compatible structure, co-continuous phase structure or spherical domain structure can easily be formed by mixing and dispersing the epoxy resin and PES as a component of the resin matrix in a solvent such as methylene chloride, dimethylformamide or the like.

Further, it has been confirmed that when using a mixed system of epoxy resin and PES, the PES-modified epoxy resin forms the quasi-homogeneous compatible structure to strengthen the matrix and the tensile strength and the tensile elongation are improved to not lower than 1.5 times as compared with those of the epoxy resin alone. Moreover, the inventors have confirmed that even when the depth of anchor is same, the peel strength of the electroless plated layer in the printed circuit board using the adhesive or adhesive layer according to the invention is made higher than the case of using only the epoxy resin as the resin matrix owing to the above strengthening of the resin matrix.

In the invention, resins provided with photosensitive group, or resins added with a resin or monomer having a photosensitivity may be used as the aforementioned thermosetting resin and/or thermoplastic resin.

In case of the resin composites having the quasi-homogeneous compatible structure, when the photosensitive group is given to the thermosetting resin or the like, the thermosetting resin can be cured and rendered into composite form by exposing to a light for a short time without proceeding the phase separation and hence the quasi-homogeneous compatible structure can easily be formed. In case of the resin composites having the co-continuous phase structure or spherical domain structure, it becomes easy to control the shape of particles )particle size or the like) of the structure.

In the invention, a photosensitive resin may be used instead of the provision of the photosensitive group to the thermosetting resin. As the photosensitive resin, use may be made of ones having 1 or several unsaturated double bonds such as acryloyl group, methacryloyl group, allyl group, vinyl group and the like in its molecule, which preferably include epoxy acrylate, polyester acrylate, polyether acrylate, silicon acrylate, polybutadiene acrylate, polystylethyl methacrylate, vinyl/acryl oligomer (obtained by copolymerizing branched acid, acid anhydride, monomer having hydroxyl group and glycidyl group with vinyl or acryl polymer and then reacting with acryl monomer), polyethylene/thiol (copolymer of olefin and mercaptane) and the like.

As the photoinitiator being important as a photocuring factor of the photosensitive resin, use may be made of at least one of intramolecular photocleavage type compounds such as benzoisobuyl ether, benzyldimethyl ketal, diethoxyacetophenone, acyloxim ester, chlorinated acetophenone, hydroxyacetophenone and the like; and intramolecular hydrogen abstraction type compounds such as benzophenone, Michlar ketone, dibenzosuberone, 2-ethylanthraquinone, isobutylthioxane and the like.

As a photoinitiating assistant, use may be made of at least one of triethanol amine, Michlar ketone, 4,4-diethylaminobenzophenone, 2-dimethylaminoethyl benzoate, ethyl 4-dimethylaminoethyl benzoate, (n-butoxy) ethyl 4-dimethylamino benzoate, isoamyl 4-dimethylamino benzoate, 2-ethylhexyl 4-dimethylamino benzoate, polymerizable tertiary amine and the like.

As a photosensitizer, Michlar ketone, Irgaqua 651, isopropyl thioxanthone and the like are preferable. Some of the above photoinitiators act as a photosensitizer.

Moreover, a composition ratio of the photoinitiator and the photosensitizer based on 100 parts by weight of the photosensitive resin is preferable as follows.

benzophenone/Michlar ketone=5 parts by weight/0.5 part by weight;

Irgaqua 184/Irgaqua 651=5 parts by weight/0.5 part by weight;

Irgaqua 907/isopropyl thioxanthone=5 parts by weight/0.5 part by weight

As a photosensitive monomer or photosensitive oligomer constituting the photosensitive resin, epoxy acrylate, epoxy methacrylate, urethane acrylate, polyester acrylate, polystyryl methacrylate and the like are favorably used.

As the curing agent for the resin matrix according to the invention, when the epoxy resin is used as the thermosetting resin, use may be made of imidazole type curing agents, diamine, polyamine, polyamide, anhydrous organic acid, vinyl phenol and the like. On the other hand, when using the thermosetting resins other than the epoxy resin, well-known curing agents may be used.

Next, dissolution-removable or decomposition-removable particulate substance used in the invention and dissolution-removable resin used at land-like dispersed state in the sea of the heat-resistant resin matrix will be described in detail.

①. As the dissolution-removable particulate substance, use may be made of "cured heat-resistant resin powder soluble in acid or oxidizing agent" or "at least one dissolution-removable particulate substance selected from inorganic particles, metal particles, elastomer particles, resin particles soluble in alkali and resin particles soluble in solvent".

(a) As regards "cured heat-resistant resin powder soluble in acid or oxidizing agent", the reason on the use of such a heat-resistant resin powder is due to the fact that the heat-resistant resin powder after the curing treatment becomes insoluble in a diluted solvent dissolving the thermosetting resin, photosensitive resin and thermoplastic resin and hence when the viscosity of the resin solution is lowered by the diluting solvent, the cured heat-resistant resin powder is uniformly dispersed in the resin solution. Furthermore, if it is intended to obtain the resin composite having the quasi-homogeneous compatible structure, the solvent is used for mixing the thermosetting resin or photosensitive resin with the thermoplastic resin at a compatible state, but even in this case, the cured heat-resistant resin powder is not dissolved in the solvent, and hence clear anchors may be formed.

Moreover, the reason why the powder is soluble in acid or oxidizing agent is due to the fact that the oxidizing agent is strong in the decomposition force and may form a clear anchor in a short time and is excellent in the productivity and also the adhesive layer having anchors formed by the oxidizing agent hardly dissolves or degrades under usual use condition.

On the other hand, the acid is needless in the neutralizing treatment as seen in the oxidizing agent and economical and also the treatment of waste liquid is easy as compared with the oxidizing agent or the like and is simple in the equipment and excellent in the safety.

As the heat-resistant resin powder, use may be made of epoxy resin, amino resin (melamine resin, urea resin, guanamine resin), polyester resin, bismaleimide triazine resin and so on.

(b) As regards "at least one dissolution-removable particulate substance selected from inorganic particles, metal particles, elastomer particles, resin particles soluble in alkali and resin particles soluble in solvent".

As the inorganic particle, use may be made of oxides such as silica, alumina, zirconia, zinc oxide, magnesia, cordierite, titania and the like; carbides such as silicon carbide, boron carbide and the like; nitrides such as aluminum nitride, boron nitride, silicon nitride and the like; carbonates such as calcium carbonate, sodium carbonate and the like; sulfates such as barium sulfate and the like; talc and so on.

The reason on the use of such inorganic particles is due to the fact that they have an effect of reducing the thermal expansion coefficient of the heat-resistant resin matrix (resin composite) and can improve the resistance to heat cycle. Particularly, the thermal conductivity of the adhesive layer can be improved when using the inorganic particles having a high thermal conductivity such as silicon carbide, aluminum nitride or the like.

As the metal particle, use may be made of aluminum, nickel, magnesium, copper, zinc, iron and so on.

The reason on the use of such metal particles is due to the fact that electromagnetic properties may be given to the adhesive layer itself.

As the elastomer particle, use may be made of rubbery resins such as polybutadiene rubber, butadiene-styrene rubber, butadiene-acrylonitrile rubber, polychloroprene rubber, polyisoprene rubber, acrylic rubber, multi-sulfur synthetic rubber, urethane rubber, fluorine rubber, silicone rubber, ABS resin and the like; thermoplastic elastomers such as polyester elastomer, polystyrene-polybutadiene-polystyrene (SBS) thermoplastic elastomer, polyolefinic thermoplastic elastomer (TPO), polyvinyl chloride thermoplastic elastomer and the like.

The reason on the use of such elastomer particles is due to the fact that they are non-heat resistant particles and are relatively low in the cost and are effective to lower the cost.

As the resin particle soluble in alkali, use may be made of cellulose resins such as cellulose nitrate, cellulose acetate, cellulose acetate butyrate, cellulose propionate, ethyl cellulose and so on.

The reason on the use of such alkali-soluble resin particles is due to the fact that they are needless in the neutralization treatment as seen in the oxidizing agent and are economical and also the treatment of waste liquid is easy as compared with the oxidizing agent or the like, simple in the equipment and excellent in the safety.

As the resin particle soluble in the solvent (organic solvent), use may be made of thermoplastic resin powder such as styrene resin, vinyl chloride resin, vinyl acetate resin and the like.

The reason on the use of the solvent-soluble resin particles is due to the fact that the surface of the adhesive layer can be roughened without using an oxidizing agent such as chromic acid or the like and hence the waste liquid is not required to be subjected to a neutralizing treatment and the production cost can be reduced.

Moreover, the inorganic particles and metal particles become insoluble in a diluted solvent dissolving the thermosetting resin, photosensitive resin and thermoplastic resin and hence when the viscosity of the resin solution is lowered by the diluting solvent, the inorganic particles or metal particles are uniformly dispersed in the resin solution. Furthermore, if it is intended to obtain the resin composite having the quasi-homogeneous compatible structure, the solvent is used for mixing the thermosetting resin or photosensitive resin with the thermoplastic resin at a compatible state, but even in this case, the inorganic particles or metal particles are not dissolved in the solvent, and hence clear anchors may be formed.

②. As the decomposition-removable particulate substance, use may be made of emulsion-polymerized low crosslinking degree amino resins (melamine resin, urea resin, guanamine resin).

The reason on the use of such a decomposition-removable particulate substance is due to the fact that the emulsion-polymerized low crosslinking degree melamine resin is decomposed under high humidity, high temperature and high pressure to form formalin and melamine monomer. Therefore, it is not required to immerse in a special roughening solution for the roughening treatment of adhesive layer surface, and hence the production equipment becomes simple and is advantageous.

③. Dissolution-removable resin used at land-like dispersed state in the sea of the heat-resistant resin matrix As such a resin, use may be made of a resin not compatible with the uncured heat resistant resin matrix before the curing and forming "sea-land structure" with this resin matrix at inhomogeneous state after the curing, and a resin compatible with the uncured heat-resistant resin matrix before the curing, causing phase separation from this resin matrix during the curing and forming "sea-land structure" with the resin matrix at inhomogeneous state after the curing.

As the former resin, there is an epoxy group terminal silicone resin.

As the latter resin, there are rubbery resins such as butadiene, ABS resin and the like, and thermoplastic resins such as polyester elastomer and the like as previously mentioned. For example, the rubbery resin dissolves in a phase solvent for the uncured heat-resistant resin matrix, but is incompatible with the uncured heat-resistant resin matrix itself, so that the inhomogeneous concentration state (sea-land structure) is exhibited by forming zones (lands) having a high rubbery resin concentration into the uncured heat-resistant resin matrix (sea).

Such a resin solution forming "sea-land structure" is difficult to control the size of the "land" and the maintenance of quality is difficult. In this point, the mass production is difficult as compared with previously cured resins capable of controlling the particle size through sieving and easily controlling the quality and the inorganic and metal particles requiring the curing treatment.

Further, the curing conditions should be adjusted in order to render the uncured heat-resistant resin matrix into the quasi-homogeneous compatible structure. Even in this point, if the uncured resin solution is existent as mentioned above, the curing condition of this resin solution should be adjusted, which is unfavorable.

However, the resin solution forming "sea-land structure" does not contain solid components such as the previously cured resin, inorganic particle, metal particles and the like, so that it is excellent in a point that the kneading time is less and the adhesive solution can easily be prepared. Furthermore, the viscosity is easily be lowered, so that the smoothness and leveling property of the coated film are excellent.

As the granulate substance in the invention, use may be made of various shapes such as spherical shape, hollow shape, pulverized piece shape and the like. Particularly, it is desirable to select from (1) particles having an average particle size of not more than 10 $\mu$m, (2) aggregate particles having an average particle size of 2–10 $\mu$m by aggregating powder having an average particle size of not more than 2 $\mu$m, (3) a mixture of powder having an average particle size of 2–10 $\mu$m and powder having an average particle size of 2 $\mu$m, and (4) false-particles obtained by adhering at least one of powder having an average particle size of not more than 2 $\mu$m and inorganic powder having an average particle size of not more than 2 $\mu$m to surfaces of powder having an average particle size of 2–10 $\mu$m. Because, when the average particle size exceeds 10 $\mu$m, anchor becomes deep and so-called fine pattern of not more than 100 $\mu$m can not be formed, while the use of the aggregate particle (2), the mixture (3) or the false-particles (4) id desirable owing to the formation of complicated anchor and the improvement of peel strength.

It is desirable that the surface of the particulate substance is coated with silica sol or the like for the prevention of aggregation.

The amount of the particulate substance is desirable to be 5–100 as a weight ratio based on 100 of resin solid content in the heat-resistant resin matrix. When the weight ratio is less than 5, anchor can not be formed, while it exceeds 100, the kneading is difficult and the heat-resistant resin matrix is relatively decreased to lower the strength of the adhesive layer.

In the invention, epoxy resin is used as a thermosetting resin component constituting the heat-resistant resin matrix hardly soluble in a roughening solution such as acid or oxidizing agent, while epoxy resin powder can be used as a heat-resistant resin powder soluble in the roughening solution such as acid or oxidizing agent. This will be described with reference to solubility against the oxidizing agent.

The properties of epoxy resin can largely be differed by controlling kind of prepolymer (relatively low molecular weight polymer having a molecular weight of about 300–10000), kind of curing agent and crosslinking density.

The difference of properties is true in the solubility to the oxidizing agent. The resin can be adjusted to an arbitrary solubility by properly selecting ① skeleton structure of monomer and curing agent, ② crosslinking structure and ③ crosslinking density. The items ① and ② are main factors, while the item ③ is subsidarily utilized.

As to the skeleton structure of monomer, aliphatic epoxy is highest in the solubility, while glycidyl amine type and glycidyl ether type are lowest in the solubility.

As to the crosslinking structure, hydroxyether structure obtained by the reaction of epoxide and amine is particularly high in the solubility, while ether structure obtained by reacting epoxide in the presence of imidazole as a curing catalyst becomes particularly low in the solubility.

The crosslinking density lowers as epoxy equivalent becomes larger and hence the solubility becomes high. Furthermore, the lowering of the solubility is attained by rendering the epoxy monomer into multi functionality. In the phenol novolak type, the solubility decreases as the repeating unit n of the monomer gradually increases from 0 to 1, 2 and the like.

Based on the difference of solubility to the oxidizing agent, therefore, "epoxy resin soluble in oxidizing agent" constituting the heat-resistant resin powder uses, for example, (A) "epoxy resin moderately crosslinked by using aliphatic epoxy as epoxy prepolymer and aliphatic amine curing agent as a curing agent and rendering epoxy equivalent into about 265".

On the contrary, as "epoxy resin hardly soluble (inclusive of insoluble) in oxidizing agent" being a thermosetting resin component of the heat-resistant resin matrix, there are used (B) "epoxy resin having an epoxy equivalent of about 170 by using bisphenol A-type epoxy resin as epoxy prepolymer and aromatic diamine curing agent as a curing agent" and (C) "epoxy resin having an epoxy equivalent of about 136 by using phenol novolak type epoxy resin as epoxy prepolymer and imidazole curing agent as a curing agent" being lower in the solubility.

Furthermore, the epoxy resin (B) may be used as "epoxy resin soluble in oxidizing agent", and in this case, the epoxy resin (C) is used as "epoxy resin hardly soluble in oxidizing agent".

As understood from the above examples, the feature that it is soluble or hardly soluble (or insoluble) in the roughening solution such as acid or oxidizing agent means a relative dissolution rate to the roughening solution such as acid, oxidizing agent or the like. That is, resins having a solubility difference may optionally be selected as a soluble resin or hardly soluble resin in the roughening solution such as acid, oxidizing agent or the like. Moreover, the means for giving the solubility difference to the resin is not restricted to ①  kind of prepolymer, ② kind of curing agent and ③ adjustment of crosslinking density and the other means may be taken.

In Table 1 are mentioned prepolymer, curing agent, epoxy equivalent and relative value of solubility as to each of the aforementioned epoxy resins.

TABLE 1

|  | Prepolymer | Curing agent | Epoxy equivalent | Relative value of solubility |
| --- | --- | --- | --- | --- |
| Epoxy resin A | aliphatic epoxy ↓ glycidyl ester epoxy | aliphatic amine ↓ hexamethylene diamine | about 265 | 1528 |
| Epoxy resin B | bisphenol A type epoxy resin | aromatic diamine ↓ diaminodiphenyl methane | about 170 | 42 |
| Epoxy resin C | phenolic novolak type epoxy resin | imidazole → 2-ethyl- -4-methyl imidazole | about 136 | 1 |

In the invention, the roughening treatment with the oxidizing agent or the like is carried out by utilizing the aforementioned solubility difference of the epoxy resin for a given time. Such a treatment violently creates the dissolution of the soluble epoxy resin fine powder having a greatest solubility to the oxidizing agent or the like to form large recess portions. Simultaneously, the epoxy resin matrix including the thermoplastic resin hardly soluble in the oxidizing agent or the like is left to form a roughened surface (anchor) as shown in FIG. 1.

In the invention, a mixture of thermosetting resin such as epoxy resin and thermoplastic resin such as PES is used as a heat-resistant resin matrix, and in this case the incorporation of the thermoplastic resin tends to decrease the solubility to the acid, oxidizing agent or the like. Particularly, when the resin composite having the quasi-homogeneous compatible structure is adopted as the heat-resistant resin matrix, the decrease of the solubility is conspicuous.

The production method of the metal film coated body according to the invention will be described below.

①. At first, the adhesive according to the invention or adhesive mainly composed of a resin mixture of thermoplastic resin and at least one or two resins selected from so-called uncured thermosetting resins and uncured photosensitive resins is applied onto a substrate, or a film formed by semi-curing the adhesive itself is laminated thereonto, or the substrate itself is formed from the adhesive, whereby a layer of the adhesive is formed. Further, the layer of the adhesive is dried and cured to form an adhesive layer in which the resin composite constituting the resin matrix has a quasi-homogeneous compatible structure, a co-continuous phase structure or a spherical domain structure.

As the substrate, mention may be made of metals, resins, paper and the like as mentioned below, and they are rendered into a given shape.

(Magnetic Medium)
  polyethylene terephthalate film, magnetic hard disc
(Electromagnetic Shield)
  filter
(Automobile)
  disc-brake body, disc-brake piston, clutch hab, oil pump cum, mission gear shaft
(Industrial Machines)
  screw, bearing
(Electric-electron Industry)
  printed circuit board, board for mounting semiconductor
(Building Materials)
  phenolic resin impregnated core paper ②. Then, at least a part of the removable particulate substance or land-shaped resin in sea-land structure dispersed in the surface of the adhesive layer is dissolved and removed by using a roughening solution such as acid, oxidizing agent, alkali, water, organic solvent or the like, or decomposed and removed under conditions of high temperature, high humidity and high pressure.

As a method of using the roughening solution, the substrate provided with the adhesive layer is immersed in the roughening solution, or the roughening solution is sprayed to the substrate, whereby the surface of the adhesive layer can be roughened.

As the oxidizing agent, chromic acid, chromate, permanganate, ozone and so on are preferable. As the acid, hydrochloric acid, nitric acid, hydrofluoric acid, sulfuric acid and organic acids are preferable.

As the alkali, sodium hydroxide, sodium carbonate, potassium hydroxide, ammonium and so on are preferable.

As the organic acid, there are methyl ethyl ketone, benzene, toluene, dioxane, acetone, trichloroethylene, ethylene dichloride, carbon disulfide, ethyl acetate, butyl acetate, tetrahydrofuran, cyclohexanone, nitroethane, pyridine, chloroform, carbon tetrachloride and so on.

The relation between the particulate substance or land-shaped resin in the sea-land structure and the roughening solution removing the same will be described below.

The oxidizing agent such as chromic acid, chromate, permanganate, ozone or the like and the acid such as hydrochloric acid, nitric acid, hydrofluoric acid, sulfuric acid, organic acid or the like are preferable with respect to the heat-resistant resin particles soluble in acid or oxidizing agent. Particularly, amino resin can use hydrochloric acid containing no heavy metal as a roughening solution, so that it is practical because the treatment of waste solution is easy.

As regards elastomers such as rubbery resin and the like, the oxidizing agent such as chromic acid, mixed solution of chromic acid and sulfuric acid, chromate, permanganate, ozone or the like is preferable as the roughening solution.

As the roughening solution for the inorganic powders, hydrofluoric acid is preferable against silica and alumina, hydrochloric acid is preferable against carbonates such as calcium carbonate, sodium carbonate or the like, and water is preferable against aluminum nitride or the like. Moreover, aluminum nitride is decomposed by water and gradually oxidized by oxygen in air, so that it is necessary to seal the metal film coated body using aluminum nitride with nitrogen or argon in use.

As to styrene resin among the particulate substance (thermoplastic resin) dissolution-removable with the organic solvent, methyl ethyl ketone, benzene, toluene, dioxane, acetone, trichloroethylene, ethylene dichloride, carbon disulfide, ethyl acetate and butyl acetate are preferable as the roughening solution, and the organic solvent such as tetrahydrofuran, cyclohexanone, nitroethane, pyridine or the like is favorable as the roughening solution to vinylchloride resin.

③. Next, the roughened surface of the adhesive layer formed on the substrate is coated with a metal film.

As a method of coating the metal film, there are electroless plating, electrolysis plating, sputtering and the like.

As the electroless plating, mention may be made of electroless copper plating, electroless nickel plating, electroless tin plating, electroless gold plating, electroless silver plating, electroless cobalt-nickel-phosphorus plating, electroless copper-nickel-phosphorus plating and the like. Particularly, at least one of electroless copper plating, electroless nickel plating, electroless gold plating, electroless cobalt-nickel-phosphorus plating and electroless copper-nickel-phosphorus plating is preferable. Moreover, the electroless plated layer may be subjected to another different electroless plating or electric plating, or may be coated with a solder.

In the electroless plating, various plated patterns may be drawn by forming a plating resist or the like.

Further, the electroless plating is carried out over a full surface and then etching may be conducted.

As a metal adhered by the spraying or the like, there are Cu, Ni, Cr, Ti, Mo, Au or an alloy thereof.

It is possible to apply the thus produced metal film coated body to various parts in automobile industry such as disc brake body, clutch hub, fuel jetting nozzle, fuel transport pipe, gear and the like; and parts in electric and electron industry such as lead frame, hermetic seal, ceramic package, connector, condenser, resistor, solar electrode, hard disc and the like; and parts in industrial machine field such as pump, valve, heat exchanger, filter, screw, dies, bearing and the like.

The method of producing a printed circuit board as the metal film coated body will be described below.

①. At first, a wiring board is used as a substrate, and then the adhesive according to the invention or so-called mainly composed of a resin mixture of thermoplastic resin and uncured thermosetting resin and/or uncured photosensitive resin is applied onto the wiring board, or a film of semi-cured adhesive itself is laminated thereonto, or the printed board itself is made from the adhesive to form a layer of the adhesive. Further, the layer of the adhesive is dried and cured to form an adhesive layer in which the resin composite constituting the resin matrix has a quasi-homogeneous compatible structure, co-continuous phase structure or spherical domain structure.

②. Then, at least a part of removable particulate substance dispersed on the surface of the adhesive layer or land-shaped resin in the sea-land structure is dissolved and removed by using a roughening solution such as acid, oxidizing agent, alkali, water, organic solvent or the like, or decomposed and removed under conditions of high temperature, high humidity and high pressure.

As the method of using the roughening solution, the use of the same roughening solution as previously mentioned can be carried out by immersing the wiring board provided with the adhesive layer in this solution, or spraying the roughening solution onto the wiring board, and hence the surface of the adhesive layer can be roughened.

③. Next, the roughened surface of the adhesive layer formed on the wiring board is subjected to an electroless plating.

As the electroless plating, mention may be made of electroless copper plating, electroless nickel plating, electroless tin plating, electroless gold plating, electroless silver plating, electroless cobalt-nickel-phosphorus plating, electroless copper-nickel-phosphorus plating and the like. Particularly, at least one of electroless copper plating, electroless nickel plating, electroless gold plating, electroless cobalt-nickel-phosphorus plating and electroless copper-nickel-phosphorus plating is preferable. Moreover, the electroless plated layer may be subjected to another different electroless plating or electric plating, or may be coated with a solder.

In the formation of the metal film coated layer, electrolysis plating, sputtering or the like may be used in addition to the electroless plating.

As the metal to be coated, there are Cu, Ni, Ct, Ti, Mo, Au and alloys thereof.

In the electroless plating, a wiring pattern may directly be drawn by forming a plating resist or the like and conducting the plating.

Alternatively, a conductor circuit may be drawn by etching the electroless plated layer formed over a full surface thereof.

As the thus obtained printed circuit board, mention may be made of ① one-side surface printed circuit board obtained by forming plated resist and conductor circuit on the substrate through the adhesive layer, ② both-surfaces printed circuit board obtained by forming plated resist and conductor circuit on both surfaces of the substrate through the adhesive layer and through-holes, and ③ build-up multi-layer printed circuit board obtained by forming conductor circuit on the substrate provided with conductor layer (which may have through-holes or multi-layer) through interlaminer insulation layer (the above adhesive layer) having through-holes at multi-layer state.

EXAMPLE 1

(1) 65 parts by weight of cresol-novolak type epoxy resin (made by Nippon Kayaku Co., Ltd. trade name: EOCN-104S, epoxy equivalent: 220, molecular weight: 5000), 40 parts by weight of polyether sulphone (PES)(made by ICI, trade name: Victrex, molecular weight: 17000), 5 parts by weight of imidazole type curing agent (made by Shikoku Kasei Co., Ltd. trade name: 2E4MZ-CN), 20 parts by weight of rubbery resin fine powder (made by Japan Synthetic Rubber Co., Ltd.) having an average particle size of 5.5 μm and 10 parts by weight of the fine powder having an average particle size of 0.5 μm are mixed and added with NMP (normal methylpyrolidone), during which the viscosity is adjusted to 120 cps in a homodisper agitating machine, and then kneaded through three rolls to obtain an adhesive solution. The viscosity at room temperature is 2–5 Pa·s.

(2) The adhesive solution is applied onto a glass-epoxy insulating substrate not provided with a copper foil (made by Toshiba Chemical Co., Ltd.) by means of roll coater (made by Thermatronics Boeki Co., Ltd.), and then dried and cured at 80° C. for 2 hours, at 120° C. for 5 hours and at 150° C. for 2 hours to form an adhesive layer having a thickness of 20 μm.

(3) The substrate provided with the adhesive layer is immersed in an aqueous solution of chromic acid ($CrO_3$, 500 g/l) at 70° C. for 15 minutes to roughen the surface, and then immersed in a neutral solution (made by Shipley) and washed with water. The roughened surface is Rmax=10 μm according to JIS-B-0601.

(4) A palladium catalyst (made by Shipley) is applied to the substrate provided with the roughened adhesive layer to activate the surface of the adhesive layer and then a plating resist is formed according to usual manner, which is immersed in an electroless plating solution for additive having a composition shown in Table 2 for 11 hours to obtain an electroless copper plated layer having a plating thickness of 25 μm, whereby a printed circuit board is manufactured (see FIG. 1).

TABLE 2

| | |
|---|---|
| Copper (CuSo$_4$ . 5H$_2$O) | 0.06 mol/l |
| Formalin | 0.30 mol/l |
| Sodium hydroxide | 0.35 mol/l |
| EDTA | 0.12 mol/l |
| Additive | slight |
| Plating temperature | 70° C. |
| pH of plating solution | 12.4 |

When only the resin corresponding to the resin matrix of the adhesive used in the invention is heat-cured under the above conditions, the resulting cured product is observed to contain resin particles having an average particle size of 0.1 μm as measured by TEM.

Figure 2:
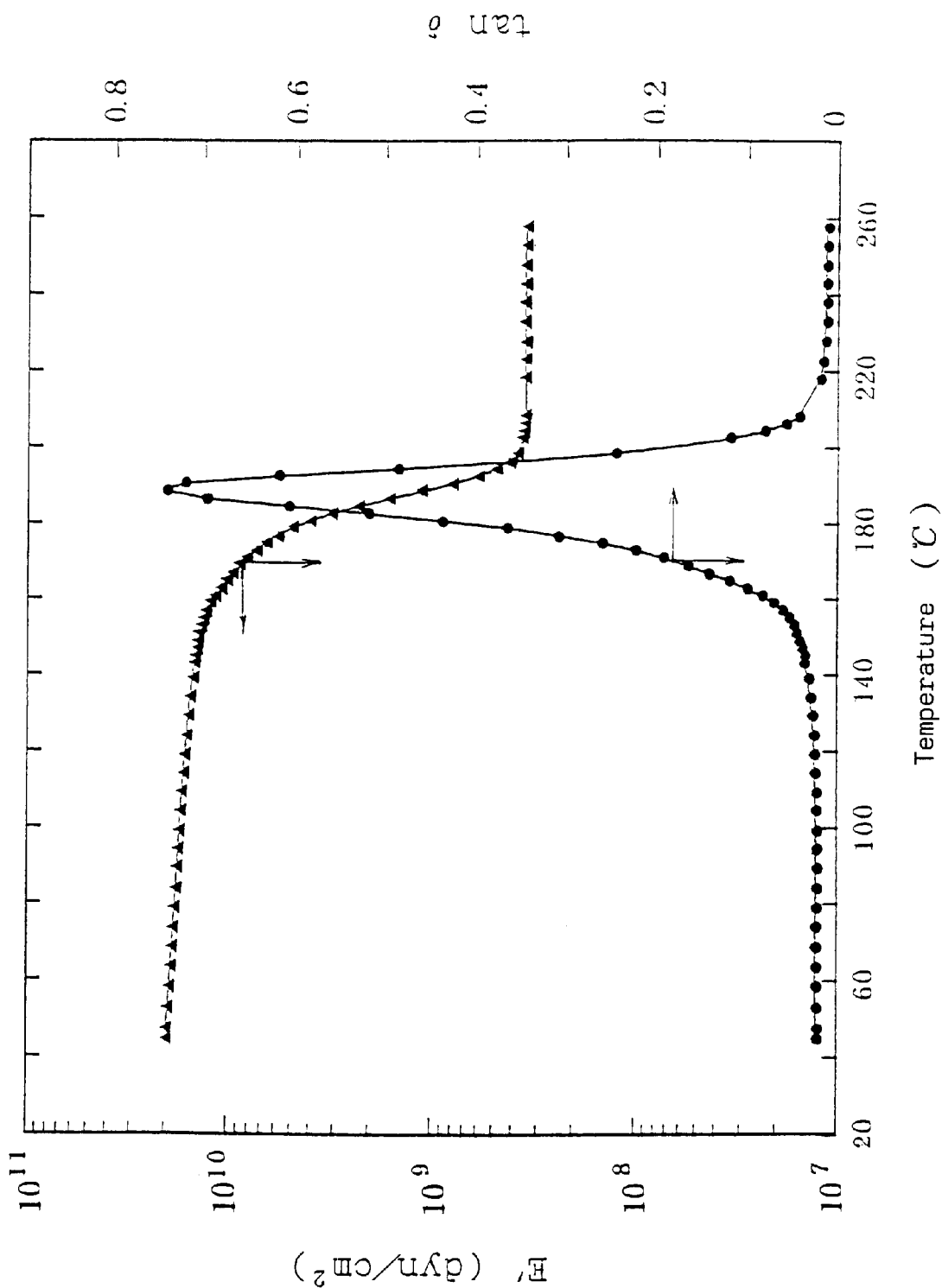
FIG. 2 is a graph showing results of dynamic viscoelasticity measured on the resin composite having a quasi-homogeneous compatible structure according to the invention.

And also, when a cured product is obtained by curing the resin mixture containing no rubbery resin fine powder, it has a peak of glass transition temperature Tg as measured by a viscoelastic test under conditions that vibration frequency is 6.28 rad/sec and temperature rising rate is 5° C./min (see FIG. 2).

Figure 3:
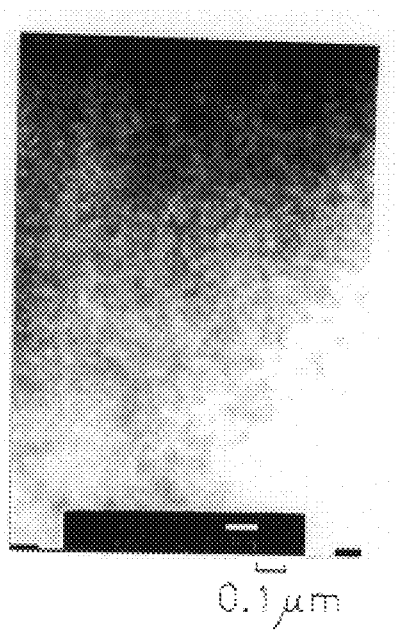
FIG. 3 is an TEM photograph of a crystal structure showing a quasi-homogeneous compatible structure of the resin composite according to the invention.

Therefore, it is considered that the resin matrix of the adhesive used in this example shows a quasi-homogeneous compatible structure (see FIG. 3).

EXAMPLE 2

(1) 70 parts by weight of cresol-novolak type epoxy resin (made by Nippon Kayaku Co., Ltd. trade name: EOCN-103S), 30 parts by weight of polyether sulphone (PES) (made by ICI, trade name: Victrex), 10 parts by weight of imidazole type curing agent (made by Shikoku Kasei Co., Ltd. trade name: 2PHZ-CN), 20 parts by weight of spherical silica fine powder (made by Nippon Shokubai Kogyo Co., Ltd.) having an average particle size of 5.5 μm and 10 parts by weight of the fine powder having an average particle size of 0.5 μm are mixed and added with NMP solvent, during which the viscosity is adjusted to 120 cps in a homodisper agitating machine, and then kneaded through three rolls to obtain an adhesive solution.

(2) The adhesive solution is applied onto a glass-epoxy insulating substrate not provided with copper foil (made by Toshiba Chemical Co., Ltd.) by means of a roll coater (made by Thermatronics Boeki Co., Ltd.), and then dried and cured at 80° C. for 3 hours, at 120° C. for 3 hours and at 150° C. for 5 hours to form an adhesive layer having a thickness of 20 μm.

(3) The substrate provided with the adhesive layer is immersed in hydrofluoric acid at 70° C. for 15 minutes to roughen the surface of the adhesive layer, which is then immersed in a neutral solution (made by Shipley) and washed with water.

(4) A palladium catalyst (made by Shipley) is applied onto the substrate provided with the roughened adhesive layer to activate the surface of the adhesive layer. Then, a plating resist is formed according to usual manner, and thereafter the substrate is immersed in an electroless plating solution for additive having the composition shown in Table 2 for 11 hours to obtain an electroless copper plated layer having a thickness of 25 μm, whereby a printed circuit board is manufactured.

When only the resin corresponding to the resin matrix of the adhesive used in this example is heat-cured under the above conditions, the resulting cured product contains resin particles having an average particle size of not more than 0.05 μm as measured by TEM.

Furthermore, when the resin mixture containing no silica fine powder is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure.

EXAMPLE 3

(1) An epoxy-modified CTBN is obtained by mixing butadiene-acrylonitrile copolymer oligomer (CTBN) and bisphenol A-type epoxy resin and then heating them at 160° C. for 2 hours.

(2) 70 parts by weight of bisphenol A-type epoxy resin (made by Yuka Shell Co., Ltd. trade name: Epikote 828, epoxy equivalent: 190, molecular weight: 380), 30 parts by weight of polyether sulphone (PES)(made by ICI, trade name: Victrex), 10 parts by weight of an imidazole type curing agent (made by Shikoku Kasei Co., Ltd. trade name: 2E4MZ-CN) and 30 parts by weight of the above epoxy-modified CTBN are mixed and added with NMP solvent, during which the viscosity is adjusted to 120 cps in a homodisper agitating machine, and then kneaded through three rolls to obtain an adhesive solution.

(3) The adhesive solution is applied onto a glass-epoxy insulating substrate not provided with copper foil (made by Toshiba Chemical Co., Ltd.) by means of a roll coater (made by Thermatronics Boeki Co., Ltd.), and then dried and cured at 80° C. for 1 hour, at 120° C. for 2 hours and at 150° C. for 4 hours to form an adhesive layer having a thickness of 20 μm.

(4) The substrate provided with the adhesive layer is immersed in an aqueous solution of chromic acid (CrO$_3$, 500 g/l) at 70° C. for 15 minutes to roughen the surface of the adhesive layer, which is then immersed in a neutral solution (made by Shipley) and washed with water.

(5) A palladium catalyst (made by Shipley) is applied onto the substrate provided with the roughened adhesive layer to activate the surface of the adhesive layer. After a plating resist is formed according to usual manner, the substrate is immersed in an electroless plating solution for additive having the composition of Table 2 for 11 hours to obtain an electroless copper plated layer having a thickness of 25 μm, whereby a printed circuit board is manufactured.

When only the resin corresponding to the resin matrix of the adhesive used in this example is heat-cured under the above conditions, the resulting cured product contains resin particles having an average particle size of not more than 0.1 μm as measured by TEM.

Furthermore, when the resin mixture containing no rubbery resin is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure.

When the resin matrix is observed by SEM, "land structure" of butadiene-acrylonitrile copolymer resin is existent in the sea of the resin matrix after the curing. That is, when the surface of the adhesive layer is treated with the oxidizing agent, the portions of the land structure are dissolved and removed to roughen the surface.

EXAMPLE 4

The same procedure as in Example 1 is basically repeated by using the following adhesive solution.

The adhesive solution is obtained by mixing 65 parts by weight of bisphenol A-type epoxy resin (made by Yuka Shell Co., Ltd. Epikote 828), 35 parts by weight of polyether sulphone (PES)(made by ICI, trade name: Victrex), 5 parts by weight of an imidazole type curing agent (made by Shikoku Kasei Co., Ltd. trade name: 2E4MZ-CN), 20 parts by weight of rubbery resin fine powder (made by Japan Synthetic Rubber co., Ltd.) having an average particle size of 5.5 μm and 10 parts by weight of the fine powder having an average particle size of 0.5 μm, adding a mixed solvent of dimethylformamide/butylcellosolve (1/1) to adjust a viscosity to 100 cps in a homodisper agitating machine and then kneading through three rolls.

The cured product obtained by curing only the resin corresponding to the resin matrix of the adhesive used in this example in the same manner as in Example 1 is observed to have a continuous structure of spheres being considered to contain rich epoxy resin having an average particle size of 0.2–2 μm (co-continuous phase structure) as observed by SEM after the section is etched with methylene chloride dissolving PES.

EXAMPLE 5

The same procedure as in Example 1 is basically repeated by using the following adhesive solution.

The adhesive solution is obtained by mixing 50 parts by weight of bisphenol A-type epoxy resin (made by Yuka Shell Co., Ltd. Epikote 828), 50 parts by weight of polyether sulphone (PES)(made by ICI, trade name: Victrex), 5 parts by weight of an imidazole type curing agent (made by Shikoku Kasei Co., Ltd. trade name: 2E4MZ-CN), 20 parts by weight of rubbery resin fine powder (made by Japan Synthetic Rubber co., Ltd.) having an average particle size of 5.5 μm and 10 parts by weight of the fine powder having an average particle size of 0.5 μm, adding DMF (dimethylformamide) to adjust a viscosity to 100 cps in a homodisper agitating machine and then kneading through three rolls.

Figure 4:
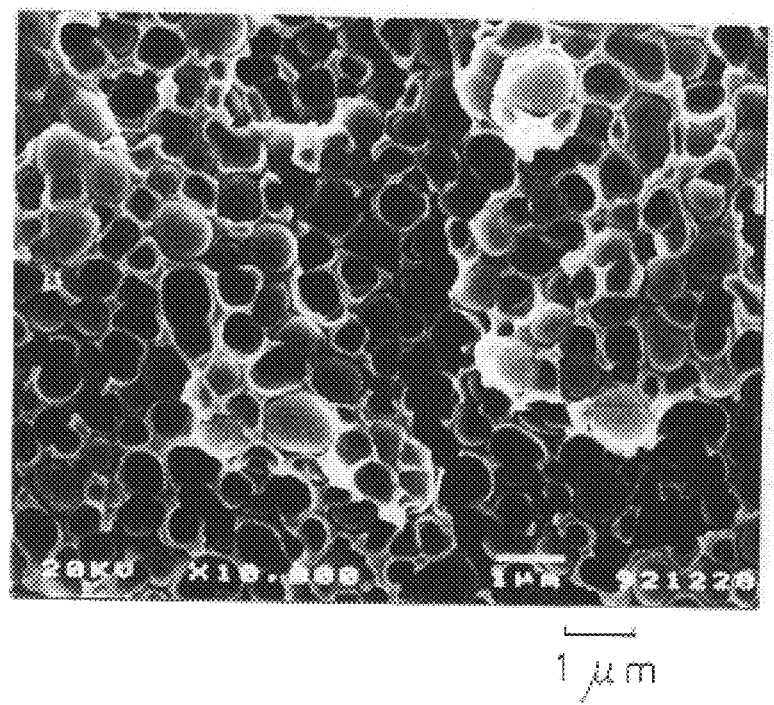
FIG. 4 is an SEM photograph of a crystal structure showing a spherical domain structure of the resin composite according to the invention.

The cured product obtained by curing only the resin corresponding to the resin matrix of the adhesive used in this example in the same manner as in Example 1 is observed to be spheres being considered to contain rich epoxy resin having an average particle size of 2–5 μm as observed by SEM after the section is etched with methylene chloride dissolving PES. Furthermore, the resin matrix is so-called sea-land structure (spherical domain structure) floating epoxy rich spheres in PES rich base (see FIG. 4).

EXAMPLE 6

(1) A photosensitive dry film (made by Dupont) is laminated onto a glass-epoxy copper lined laminated substrate (made by Toshiba Chemical Co., Ltd.) and exposed to ultra-violet ray through a mask film pictured with a given conductor circuit pattern. Then, the pattern is developed with 1,1,1-trichloroethane, and copper is removed from non-conductor portion with an etching solution copper chloride, and thereafter the dry film is peeled off with methylene chloride. Thus, there is prepared a printed circuit board having a first conductor circuit comprised of plural conductor patterns on the substrate.

(2) To an alumina particle obtained by dispersing 200 g of alumina particles (made by Nippon Light Metal Co., Ltd. trade name: AX34, average particle size: 3.9 μm) in 5 liters of acetone is added dropwise a suspension obtained by dispersing 300 g of alumina powder (made by Nippon Light Metal Co., Ltd. trade name: AX34, average particle size: 0.5 μm) in an acetone solution of 30 g of epoxy resin (made by Mitsui Petroleum Chemical Co., Ltd.) per 1 liter of acetone with stirring in a Henshell mixer, whereby the alumina powder is adhered to the surfaces of the alumina particles. After acetone is removed, the mixture is heated to 150° C. to form alumina false-particles. The false-particles have an average particle size of about 4.3 μm, about 75% by weight of which is existent within a range of ±2 μm around the value of the average particle size.

(3) 70 parts by weight of 50% acrylated product of cresol-novolak type epoxy resin (made by Yuka Shell Co., Ltd. epoxy equivalent: 210, molecular weight: 2000), 30 parts by weight of polyether sulphone (PES), 15 parts by weight of diallylterephthalate, 4 parts by weight of 2-methyl-1-[4-(methylthio)phenyl]-morpholinopropanone-1 (made by Ciba Geigy) and 4 parts by weight of an imidazole type curing agent (made by Shikoku Kasei Co., Ltd. trade name: 2E4MZ-CN) are mixed with 50 parts by weight of the alumina false-particles prepared in the above item (2), added with butylcellosolve to adjust a viscosity to 250 cps in a homodisper agitating machine, and then kneaded through three roll to prepare a photosensitive adhesive solution.

(4) The photosensitive adhesive solution is applied onto the printed circuit board prepared in the item (1) by means of a roll coater, left to stand at a horizontal state for 20 minutes and dried at 70° C. to form a photosensitive adhesive layer having a thickness of about 50 μm.

(5) The printed circuit board treated in the item (4) is closed with a photomask film printed with black circles of 100 μmφ, which is exposed to a super-high pressure mercury lamp of 500 mJ/cm². It is subjected to an ultra-sonic development with a solution of DMDG (diethylene glycol dimethyl ether) to form openings as via-holes of 100 μmφ on the board. Furthermore, the printed circuit board is exposed to a super-high pressure mercury lamp of about 3000 mJ/cm² and subjected to a heat treatment at 100° C. for 1 hour and at 150° C. for 5 hours to form an adhesive layer having an opening corresponding to the photomask film in an excellent dimensional accuracy.

(6) The printed circuit board treated in the item (5) is treated with hydrofluoric acid and immersed in potassium permanganate ($KMnO_4$, 500 g/l) at 70° C. for 15 minutes to roughen the surface of the adhesive layer, which is then immersed in a neutral solution (made by Shipley) and washed with water.

(7) A palladium catalyst (made by Shipley) is applied onto the board provided with the roughened adhesive layer to activate the surface of the adhesive layer, and thereafter immersed in an electroless plating solution for additive having the composition of Table 2 for 11 hours to obtain an electroless copper plated layer having a thickness of 25 μm.

Figure 5:
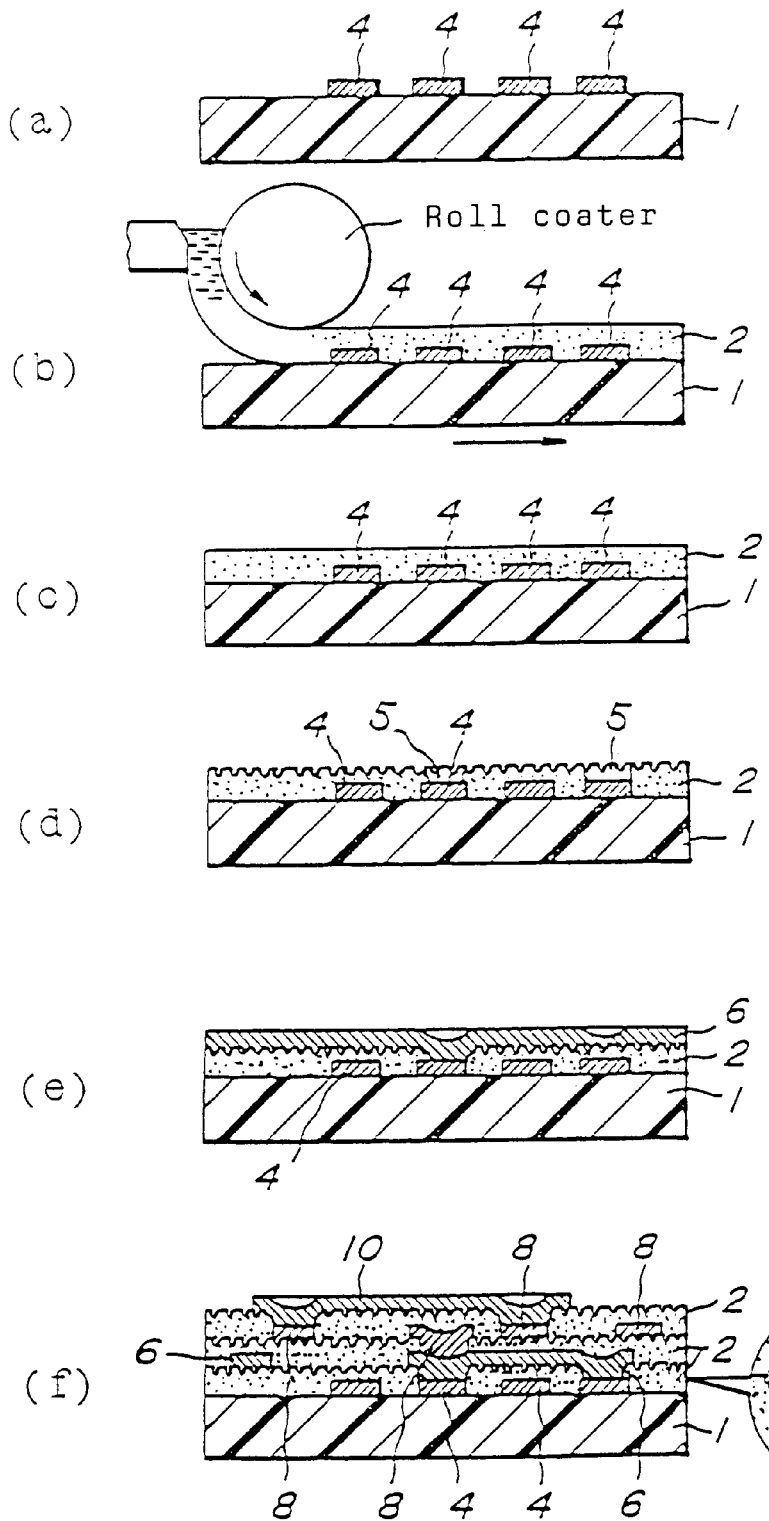
FIGS. 5(a) to 5(f) is a flow sheet illustrating the production steps of another embodiment of the printed circuit board according to the invention.

(8) The steps of the items (4)–(7) are repeated 2 times and further the step of the item (1) is repeated to manufacture a build-up multi-layer printed circuit board in which the wiring layers are 4 (see FIG. 5).

Figure 6:
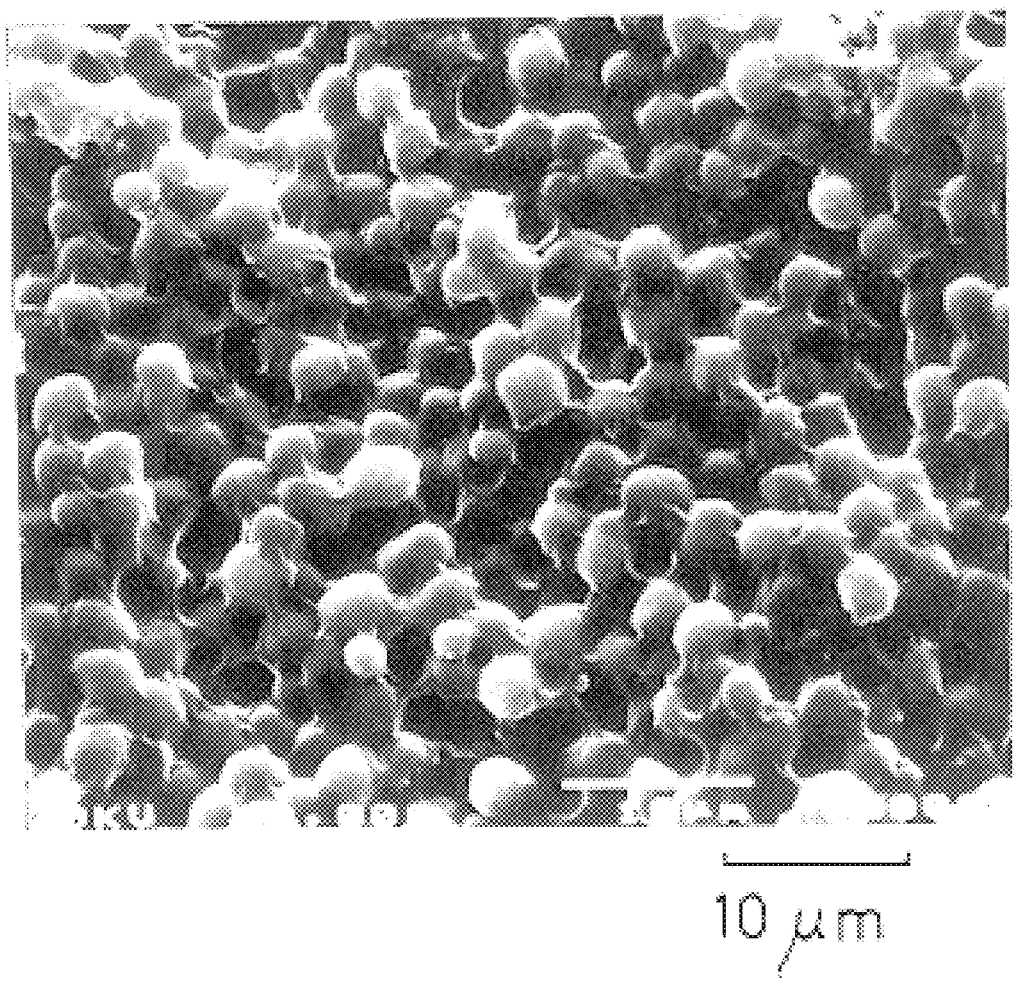
FIG. 6 is an SEM photograph of a crystal structure showing a co-continuous phase structure of the resin composite according to the invention.

The cured product obtained by curing only the resin corresponding to the resin matrix of the adhesive used in this example under the above conditions is observed to have a continuous structure of spheres being considered to contain rich epoxy resin having an average particle size of 0.2–2 μm (co-continuous phase structure) as observed by SEM after the section is etched with methylene chloride (see FIG. 6).

Figure 7:
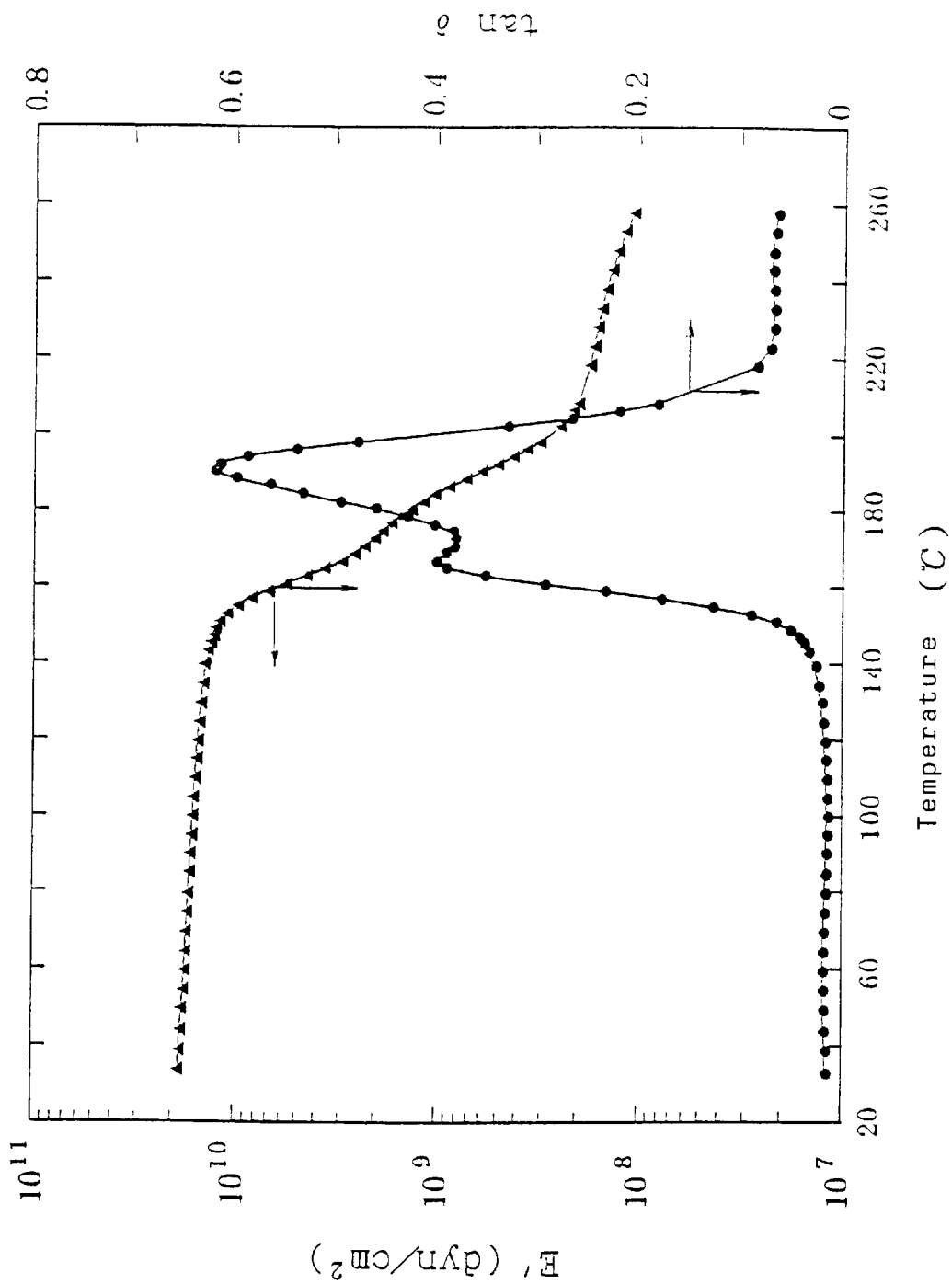
FIG. 7 is a graph showing results of dynamic viscoelasticity measured on the resin composite having a co-continuous phase structure according to the invention.

Furthermore, the cured product obtained by curing the mixture of the resin composition having no the above alumina false-particle has two peaks of glass transition temperature Tg as measured by the viscoelastic measuring test under conditions that a vibration frequency is 6.28 rad/sec and a temperature rising rate is 5° C./sec (see FIG. 7).

Therefore, the resin matrix of the adhesive used in this example is considered to exhibit a co-continuous phase structure.

EXAMPLE 7

(1) A photosensitive dry film (made by DuPont) is laminated onto a glass-epoxy copper lined laminated substrate (made by Toshiba Chemical Co., Ltd.) and exposed to ultra-violet ray through a mask film pictured with a given conductor circuit pattern. Then, the pattern is developed with 1,1,1-trichloroethane, and copper is removed from non-conductor portion with an etching solution copper chloride, and thereafter the dry film is peeled off with methylene chloride. Thus, there is prepared a printed circuit board having a first conductor circuit comprised of plural conductor patterns on the substrate.

(2) Epoxy oligomer (CNA25, molecular weight: 4000) of cresol novolak type epoxy resin dissolved in DMDG (diethylene glycol dimethyl ether) in which 25% of epoxy group is acrylated to provide a photosensitivity, PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy trade name: I-907) are mixed according to the following composition in NMP solvent, and mixed with 20 parts by weight of rubbery resin fine powder (made by Japan Synthetic Rubber Co., Ltd.) having an average particle size of 5.5 μm and 10 parts by weight of the powder having an average particle size of 0.5 μm to adjust a viscosity to 120 cps in a homodisper agitating machine and then kneaded through three rolls to obtain a photosensitive adhesive solution.

Resin composition: photosensitized epoxy/PES/M215/I-907/imidazole=75/25/10/5/5

(3) The photosensitive adhesive solution is applied onto the printed circuit board prepared in the item (1) by means of a roll coater, left to stand at a horizontal state for 20 minutes and dried at 60° C.

(4) The printed circuit board treated in the item (3) is closed with a photomask film printed with black circles of 100 μmφ, which is exposed to a super-high pressure mercury lamp of 500 mJ/cm². It is subjected to an ultra-sonic development with a DMDG solution to form openings as via-holes of 100 μmφ on the board. Furthermore, the printed circuit board is exposed to a super-high pressure mercury lamp of about 3000 mJ/cm² and subjected to a heat treatment at 100° C. for 1 hour and at 150° C. for 5 hours to form an adhesive layer of 50 μm in thickness having an opening corresponding to the photomask film in an excellent dimensional accuracy.

(5) The printed circuit board treated in the item (4) is immersed in potassium permanganate (KMnO₄, 500 g/l) at 70° C. for 15 minutes to roughen the surface of the adhesive layer, which is then immersed in a neutral solution (made by Shipley) and washed with water.

(6) A palladium catalyst (made by Shipley) is applied onto the board provided with the roughened adhesive layer to activate the surface of the adhesive layer, and thereafter immersed in an electroless plating solution for additive having the composition of Table 2 for 11 hours to obtain an electroless copper plated layer having a thickness of 25 μm.

(7) The steps of the items (3)–(6) are repeated 2 times and further the step of the item (1) is repeated to manufacture a build-up multi-layer printed circuit board in which the wiring layers are 4.

The cured product obtained by drying, UV-curing and thermal-curing only the resin corresponding to the resin matrix of the adhesive used in this example under the above conditions is observed to contain resin particles having an average particle size of not more than 0.1 μm as observed by TEM in the same manner as in Example 1.

Furthermore, the cured product obtained by curing the mixture of the resin composition having no the above rubbery resin fine powder has one peak of glass transition temperature Tg as measured by the viscoelastic measuring test under conditions that a vibration frequency is 6.28 rad/sec and a temperature rising rate is 5° C./sec.

Therefore, the resin matrix of the adhesive used in this example is considered to exhibit a quasi-homogeneous compatible structure (see FIG. 3).

Figure 8:
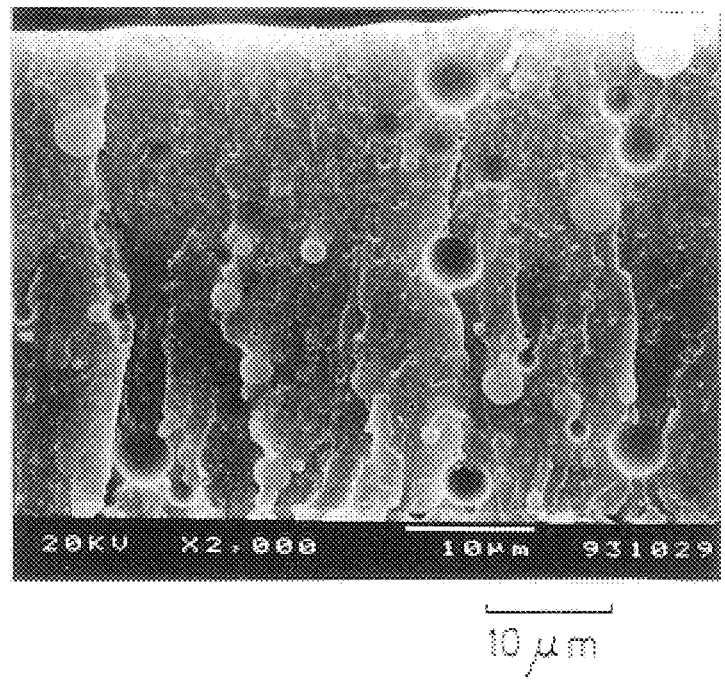
FIG. 8 is an SEM photograph of a crystal structure at section of an adhesive layer after the drying and before the curing.
Figure 9:
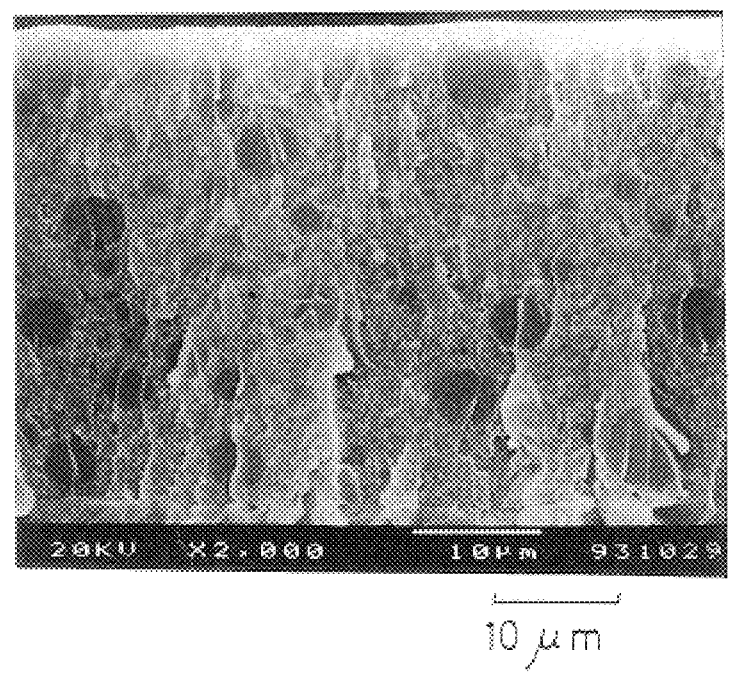
FIG. 9 is an SEM photograph of a crystal structure at section of the adhesive layer after the curing.

Moreover, SEM photographs at section of the adhesive layer before and after the curing are shown in FIGS. 8 and 9.

EXAMPLE 8

The same procedure as in Example 7 is basically repeated by using the following adhesive solution.

A photosensitive adhesive solution is obtained by mixing epoxy oligomer (CNA25, molecular weight: 4000) of cresol novolak type epoxy resin in which 25% of epoxy group is acrylated to provide a photosensitivity, PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy trade name: I-907) according to the following composition in NMP (dimethylformamide) solvent, and mixing with 20 parts by weight of rubbery resin fine powder (made by Japan Synthetic Rubber Co., Ltd.) having an average particle size of 5.5 μm and 10 parts by weight of the powder having an average particle size of 0.5 μm to adjust a viscosity to 120 CPS in a homodisper agitating machine and then kneading through three rolls.

Resin composition: photosensitized epoxy/PES/M215/I-907/imidazole=75/25/10/5/5

The curing of the adhesive is carried out by drying at 80° C., UV-curing and then thermal-curing.

The cured product obtained by curing only the resin corresponding to the resin matrix of the adhesive used in this example under the above conditions is observed to have a continuous structure of spheres being considered to contain rich epoxy resin having an average particle size of 0.2–2 μm (co-continuous phase structure) as observed by SEM after the section is etched with methylene chloride.

EXAMPLE 9

The same procedure as in Example 7 is basically repeated by using the following adhesive solution.

A photosensitive adhesive solution is obtained by mixing epoxy oligomer (CNA25, molecular weight: 4000) of cresol novolak type epoxy resin in which 25% of epoxy group is acrylated to provide a photosensitivity, PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy trade name: I-907) according to the following composition in NMP (dimethylformamide) solvent, and mixing with 20 parts by weight of rubbery resin fine powder having an average particle size of 5.5 μm and 10 parts by weight of the powder having an average particle size of 0.5 μm to adjust a viscosity to 120 CPS in a homodisper agitating machine and then kneading through three rolls.

Resin composition: photosensitized epoxy/PES/M215/I-907/imidazole 75/25/10/5/5

The curing of the adhesive is carried out by drying at 100° C., UV-curing and then thermal-curing.

The cured product obtained by curing only the resin corresponding to the resin matrix of the adhesive used in this example in the same manner as in Example 1 is observed to be spheres being considered to contain rich epoxy resin having an average particle size of 2–5 μm as observed by SEM after the section is etched with methylene chloride dissolving PES. Furthermore, the resin matrix is so-called sea-land structure (spherical domain structure) floating epoxy rich spheres in PES rich base.

It has been confirmed from Example 7 to Example 9 that the cured product having the quasi-homogeneous compatible structure, co-continuous phase structure or spherical domain structure is obtained from the adhesive having the same composition by varying the drying condition. Because, when the photosensitive adhesive has the homogeneous structure at the time of drying, the curing is rapidly carried out by photo-curing and hence the phase separation is not relatively caused by the subsequent thermal-curing.

Moreover, the phase diagram is shown in FIGS. 10–12 for the reference. These phase diagrams are obtained by using photosensitized epoxy/PES/TMPTA/I-907/imidazole=75/25/20/5/5, which is different from the preparing condition of the adhesive in Examples 7–9.

EXAMPLE 10

The same procedure as in Example 7 is basically repeated by using the following adhesive solution.

A photosensitive adhesive solution is obtained by mixing epoxy oligomer (made by Yuka Shell Co., Ltd.) of cresol novolak type epoxy resin in which 100% of epoxy group is acrylated to provide a photosensitivity, PES, an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy trade name: I-907) according to the following composition in NMP (dimethylformamide) solvent, and mixing with 20 parts by weight of rubbery resin fine powder (made by Japan Synthetic Rubber Co., Ltd.) having an average particle size of 5.5 μm and 10 parts by weight of the powder having an average particle size of 0.5 μm to adjust a viscosity to 120 CPS in a homodisper agitating machine and then kneading through three rolls.

Resin composition: photosensitized epoxy/PES/M215/I-907/imidazole=80/20/10/5/5

When only the resin corresponding to the resin matrix of the adhesive used in this example is cured in the same manner as in Example 7, the resulting cured product contains resin particles having an average particle size of not more than 0.1 μm as measured by TEM likewise Example 1.

Furthermore, when the resin mixture containing no rubbery resin is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure (see FIG. 3).

EXAMPLE 11

The same procedure as in Example 7 is basically repeated by using the following adhesive solution.

A photosensitive adhesive solution is obtained by mixing epoxy oligomer (made by Yuka Shell Co., Ltd.) of cresol novolak type epoxy resin in which 100% of epoxy group is acrylated to provide a photosensitivity, phenoxy resin, an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba GeigY trade name: I-907) according to the following composition in DMF, and mixing with 30 parts by weight of aggregated rubbery resin fine powder having an average particle size of 3.5 μm (see the production method described in Example 1 of JP-A-1-301775) to adjust a viscosity to 120 cps in a homodisper agitating machine while adding DMF solvent, and then kneading through three rolls.

Resin composition: photosensitized epoxy/phenoxy/M215/I-907/imidazole=79/30/10/5/5

The cured product obtained by curing only the resin corresponding to the resin matrix of the adhesive used in this example in the same manner as in Example 7 is observed to have a continuous structure of spheres being considered to contain rich epoxy resin having an average particle size of 0.2–2 μm (co-continuous phase structure) as observed by SEM after the section is etched with 2-butanone dissolving the phenoxy resin.

EXAMPLE 12

The same procedure as in Example 7 is basically repeated by using the following adhesive solution.

A photosensitive adhesive solution is obtained by mixing epoxy oligomer (made by Yuka Shell Co., Ltd.) of cresol novolak type epoxy resin in which 100% of epoxy group is acrylated to provide a photosensitivity, PSF, an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy trade name: I-907) according to the following composition in DMF, and mixing with 30 parts by weight of aggregated rubbery resin fine powder having an average particle size of 3.5 μm (see the production method described in Example 1 of JP-A-1-301775) to adjust a viscosity to 120 cps in a homodisper agitating machine while adding DMF solvent, and then kneading through three rolls.

Resin composition: photosensitized epoxy/PSF/M215/I-907/imidazole=60/40/10/5/5

The cured product obtained by curing only the resin corresponding to the resin matrix of the adhesive used in this example in the same manner as in Example 7 is observed to be spheres being considered to contain rich epoxy resin having an average particle size of 2–5 μm as observed by SEM after the section is etched with methylene chloride dissolving PSF. Furthermore, the resin matrix is so-called sea-land structure (spherical domain structure) floating epoxy rich spheres in PES rich base.

EXAMPLE 13

The same procedure as in Example 5 is basically repeated except that zirconia (made by Nippon Shokubai Kagaku Kogyo Co., Ltd. trade name: NS-OY-S) is used instead of the rubbery resin fine powder and hydrofluoric acid is used as a roughening solution.

Moreover, the resin structure of the resin matrix of the adhesive used in this example is a spherical domain structure.

EXAMPLE 14

The same procedure as in Example 8 is basically repeated except that magnesia (made by Iwatani Kagaku Kogyo Co., Ltd. trade name: MTK-30) is used instead of the rubbery resin fine powder and 6N hydrochloric acid is used as a roughening solution.

Moreover, the resin structure of the resin matrix of the adhesive used in this example is a co-continuous phase structure.

EXAMPLE 15

The same procedure as in Example 9 is basically repeated except that aluminum hydroxide (made by Nippon Keikogyo Co., Ltd. trade name: B103.T) is used instead of the rubbery resin fine powder and an aqueous ammonia solution is used as a roughening solution.

Moreover, the resin structure of the resin matrix of the adhesive used in this example is a spherical domain structure.

EXAMPLE 16

The same procedure as in Example 4 is basically repeated by using the following adhesive solution.

An adhesive solution is obtained by mixing butadiene-acrylonitrile copolymer oligomer (CTBN) with bisphenol A-type epoxy resin, heating at 160° C. for 2 hours to form an epoxy-modified CTBN, mixing 30 parts by weight of the resulting resin solution with 65 parts by weight of bisphenol A-type epoxy resin (made by Yuka Shell Co., Ltd. Epikote 828), 35 parts by weight of polyether sulphone (PES)(made by ICI trade name: Victrex) and 5 parts by weight of an imidazole type curing agent (made by Shikoku Kasei Co., Ltd. trade name: 2E4MZ-CN), adjusting a viscosity to 100 cps in a homodisper agitating machine while adding a mixed solvent of dimethylformamide/butylcellosolve (1/1), and then kneading through three rolls.

The cured product obtained by curing only the resin corresponding to the resin matrix of the adhesive used in this example in the same manner as in Example 4 is observed to have a continuous structure of spheres being considered to contain rich epoxy resin having an average particle size of 0.2–2 $\mu$M (co-continuous phase structure) as observed by SEM after the section is etched with methylene chloride dissolving PES.

Furthermore, it is observed by SEM that "land structure" of butadiene-acrylonitrile copolymer rubber resin is existent in sea of the resin matrix.

EXAMPLE 17

The same procedure as in Example 5 is basically repeated by using the following adhesive solution.

An adhesive solution is obtained by mixing butadiene-acrylonitrile copolymer oligomer (CTBN) with bisphenol A-type epoxy resin, heating at 160° C. for 2 hours to form an epoxy-modified CTBN, mixing 30 parts by weight of the resulting resin solution with 50 parts by weight of bisphenol A-type epoxy resin (made by Yuka Shell Co., Ltd. Epikote 828), 50 parts by weight of polyether sulphone (PES)(made by ICI trade name: Victrex) and 5 parts by weight of an imidazole type curing agent (made by Shikoku Kasei Co., Ltd. trade name: 2E4MZ-CN), adjusting a viscosity to 100 cps in a homodisper agitating machine while adding DMF, and then kneading through three rolls.

The cured product obtained by curing only the resin corresponding to the resin matrix of the adhesive used in this example in the same manner as in Example 5 is observed to have spheres being considered to contain rich epoxy resin having an average particle size of 2–5 $\mu$m as observed by SEM after the section is etched with methylene chloride dissolving PES. This resin matrix is so-called sea-land structure (spherical domain structure) in which epoxy rich spheres are floated in PES rich base (see FIG. 4).

Furthermore, it is observed by SEM that "land structure" of butadiene-acrylonitrile copolymer rubber resin is existent in sea of the resin matrix.

EXAMPLE 18

The same procedure as in Example 7 is basically repeated by using the following adhesive solution.

An adhesive solution is obtained by mixing butadiene-acrylonitrile copolymer oligomer (CTBN) with bisphenol A-type epoxy resin, heating at 160° C. for 2 hours to form an epoxy-modified CTBN, mixing 30 parts by weight of the resulting resin solution with epoxy oligomer of novolak type epoxy resin dissolved in DMDG in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, benzophenone (made by Kanto Kagaku Co., Ltd.) as a photoinitiator and Michlars ketone (made by Kanto Kagaku Co., Ltd.) as a photosensitizer according to the following composition in NMP, adjusting a viscosity to 120 cps in a homodisper agitating machine, and then kneading through three rolls.

Resin composition: photosensitized epoxy/PES/M215/BP/imidazole=75/25/10/5/0.5/5

When only the resin corresponding to the resin matrix of the adhesive used in this example is cured in the same manner as in Example 7, the resulting cured product contains resin particles having an average particle size of not more than 0.1 $\mu$m as measured by TEM likewise Example 1.

Furthermore, when the resin mixture containing no rubbery resin is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure (see FIG. 3).

Furthermore, it is observed by SEM that "land structure" of butadiene-acrylonitrile copolymer rubber resin is existent in sea of the resin matrix.

EXAMPLE 19

The same procedure as in Example 8 is basically repeated by using the following adhesive solution.

An adhesive solution is obtained by mixing butadiene-acrylonitrile copolymer oligomer (CTBN) with bisphenol A-type epoxy resin, heating at 160° C. for 2 hours to form an epoxy-modified CTBN, mixing 30 parts by weight of the resulting resin solution with epoxy oligomer of novolak type epoxy resin dissolved in DMDG in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy, trade name: I-907) according to the following composition in DMF, adjusting a viscosity to 120 cps in a homodisper agitating machine, and then kneading through three rolls.

Resin composition: photosensitized epoxy/PES/M215/I-907/imidazole=75/25/10/5/5

The cured product obtained by curing only the resin corresponding to the resin matrix of the adhesive used in this example in the same manner as in Example 8 is observed to have a continuous structure of spheres being considered to contain rich epoxy resin having an average particle size of 0.2–2 μm (co-continuous phase structure) as observed by SEM after the section is etched with methylene chloride.

Furthermore, it is observed by SEM that "land structure" of butadiene-acrylonitrile copolymer rubber resin is existent in sea of the resin matrix.

EXAMPLE 20

The same procedure as in Example 9 is basically repeated by using the following adhesive solution.

An adhesive solution is obtained by mixing butadiene-acrylonitrile copolymer oligomer (CTBN) with bisphenol A-type epoxy resin, heating at 160° C. for 2 hours to form an epoxy-modified CTBN, mixing 30 parts by weight of the resulting resin solution with epoxy oligomer of novolak type epoxy resin dissolved in DMDG in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy, trade name: I-907) according to the following composition in DMF, adjusting a viscosity to 120 cps in a homodisper agitating machine, and then kneading through three rolls.

Resin composition: photosensitized epoxy/PES/M215/I-907/imidazole=75/25/10/5/5

The cured product obtained by curing only the resin corresponding to the resin matrix of the adhesive used in this example in the same manner as in Example 9 is observed to have spheres being considered to contain rich epoxy resin having an average particle size of 2–5 μm as observed by SEM after the section is etched with methylene chloride dissolving PES. This resin matrix is so-called sea-land structure (spherical domain structure) in which epoxy rich spheres are floated in PES rich base.

Furthermore, it is observed by SEM that "land structure" of butadiene-acrylonitrile copolymer rubber resin is existent in sea of the resin matrix.

EXAMPLE 21

The same procedure as in Example 7 is basically repeated by using the following adhesive solution.

An adhesive solution is obtained by mixing epoxy oligomer of novolak type epoxy resin in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, and a photoinitiator (made by Ciba Geigy, trade name: I-907) according to the following composition in DMF, mixing the resulting mixture with 25 parts by weight of epoxy group terminated silicone resin, adjusting a viscosity to 120 cps in a homodisper agitating machine, and then kneading through three rolls.

Resin composition: photosensitized epoxy/PES/M215/I-907/imidazole=70/30/10/5/5

When only the resin corresponding to the resin matrix of the adhesive used in this example is cured in the same manner as in Example 7, the resulting cured product contains resin particles having an average particle size of not more than 0.1 μm as measured by TEM likewise Example 1.

Furthermore, when the resin mixture containing no epoxy group terminated silicone resin is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure.

EXAMPLE 22

(1) 65 parts by weight of cresol-novolak type epoxy resin (made by Nippon Kayaku Co., Ltd. trade name: EOCN-104S, epoxy equivalent: 220, molecular weight: 5000), 40 parts by weight of polyether sulphone (PES)(made by ICI, trade name: Victrex, molecular weight: 17000), 5 parts by weight of imidazole type curing agent (made by Shikoku Kasei Co., Ltd. trade name: 2E4MZ-CN), 20 parts by weight of melamine resin powder having a low crosslinking degree and an average particle size of 5.5 μm and 10 parts by weight of the same powder having an average particle size of 0.5 μm are mixed and added with NMP, during which the viscosity is adjusted to 120 cps in a homodisper agitating machine, and then kneaded through three rolls to obtain an adhesive solution. In this case, the viscosity at room temperature is 2–5 Pa·s.

(2) The adhesive solution is applied onto both surfaces of a glass-epoxy insulating substrate, which is left to stand at a horizontal state for 20 minutes and then dried at 60° C. and cured by heating at 100° C. for 1 hour and at 150° C. for 5 hours to form a resin adhesive layer having a thickness of about 50 μm.

Figure 13:
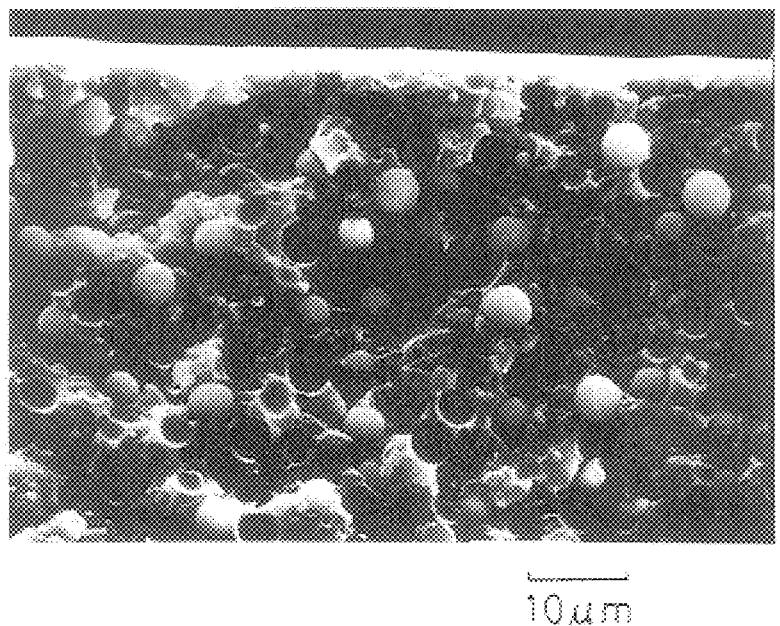
FIG. 13 is an SEM photograph of a crystal structure at section of the adhesive layer showing a state of decomposable granule (low-polymerized melamine resin) before the decomposition.
Figure 14:
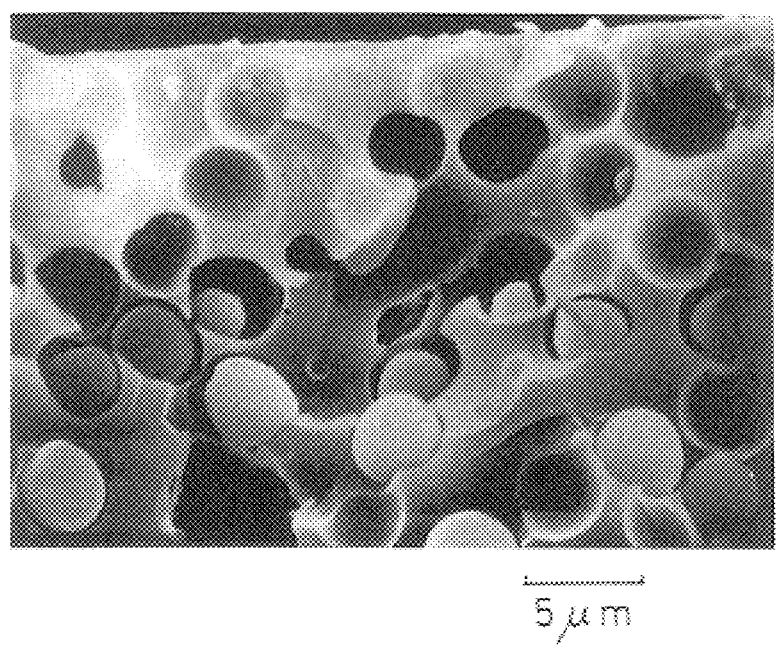
FIG. 14 is an SEM photograph of a crystal structure at section of the adhesive layer showing a state of decomposable granule (low-polymerized melamine resin) after the decomposition.

(3) The substrate provided on both surfaces with the adhesive layers is left to stand in saturated steam at 121° C. and 2 atmospheric pressure for 2 hours to decompose and remove melamine resin powder on the surface of the adhesive layer. Electron microscopic (SEM) photographs before and after the decomposing removal are shown in FIG. 13 and FIG. 14, respectively. As seen from these photographs, the melamine resin becomes small by the decomposition.

(4) A palladium catalyst (made by Shipley) is applied to the substrate having the roughened surface of the resin insulating layer to activate the surface of the insulating layer and thereafter immersed in an electroless copper plating solution for 11 hours to obtain an electroless copper plated layer having a thickness of 25 μm, whereby a laminated substrate lined on both surfaces with copper is manufactured.

(5) Through-holes are formed in the laminated substrate.

(6) A palladium nucleus (made by Shipley) is applied and then a photoresist is applied, which is exposed to a light and developed to form a plating resist.

(7) An electroless copper plating is carried out in the usual manner and then an electric copper plating is carried out to form a conductor circuit portion.

(8) After the plating resist is peeled, an etching is carried out with ferric chloride to remove copper film between the patterns to thereby manufacture a printed circuit board.

When only the resin corresponding to the resin matrix of the adhesive used in this example is heat-cured under the above conditions, the resulting cured product contains resin particles having an average particle size of not more than 0.1 $\mu$m as measured by TEM likewise Example 1.

Furthermore, when the resin mixture containing no melamine resin powder is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure (see FIG. 3).

EXAMPLE 23

The same procedure as in Example 7 is basically repeated by using the following adhesive solution.

An adhesive solution is obtained by mixing epoxy oligomer of cresol-novolak type epoxy resin in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), an acrylated isothiocyanate (made by Toa Gosei Co., Ltd. trade name: Aronics M215) as a photosensitive monomer, benzophenone (BP) as a photoinitiator (made by Kanto Kagaku Co., Ltd.) and Michlar ketone as a photosensitizer (made by Kanto Kagaku Co., Ltd.) according to the following composition in DMDG, adding with powder of cellulose acetate butyrate, adjusting a viscosity to 120 cps in a homodisper agitating machine with NMP, and then kneading through three rolls.

Resin composition: photosensitized epoxy/PES/M215/BP/imidazole=75/25/10/5/0.5/5

Moreover, the roughening is carried out by immersing in an aqueous solution of 1M sodium hydroxide at 80° C. to hydrolize cellulose acetate butyrate.

When only the resin corresponding to the resin matrix of the adhesive used in this example is cured in the same manner as in Example 7, the resulting cured product contains resin particles having an average particle size of not more than 0.1 $\mu$m as measured by TEM likewise Example 1.

Furthermore, when the resin mixture containing no rubbery resin is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure.

In the printed circuit boards produced in Examples 1–23, the peel strength of the electroless copper plated layer, and the insulation resistance and glass transition temperature Tg of the interlaminar resin insulating layer are measured. Further, heat cycle test is carried out at −65° C.×30 min to 125° C.×30 min. The measured results are shown in Table 3. As seen from the results of this table, printed circuit boards having considerably improved adhesion strength, insulating property, heat resistance and heat cycle property can be manufactured by using the adhesive according to the invention in which the resin composite exhibiting the quasi-homogeneous compatible structure, co-continuous phase structure or spherical domain structure is used as a resin matrix.

TABLE 3

| Example | Peel strength (kg/cm) | Insulation resistance ($\Omega$) | Tg (° C.) | Heat cycle property | Dielectric resistance |
|---|---|---|---|---|---|
| 1  | 2.2 | $10^8$<    | 150 | 300<  | 4.3 |
| 2  | 1.4 | $10^{11}$< | 220 | 2000< | 5.0 |
| 3  | 2.3 | $10^8$<    | 145 | 500<  | 4.4 |
| 4  | 2.0 | $10^8$<    | 150 | 500<  | 4.3 |
| 5  | 2.2 | $10^8$<    | 160 | 500<  | 4.2 |
| 6  | 1.5 | $10^{10}$< | 210 | 2000< | 5.3 |
| 7  | 1.9 | $10^9$<    | 155 | 500<  | 4.7 |
| 8  | 2.5 | $10^8$<    | 150 | 300<  | 4.4 |
| 9  | 2.4 | $10^8$<    | 145 | 300<  | 4.3 |
| 10 | 2.5 | $10^9$<    | 150 | 300<  | 4.4 |
| 11 | 1.9 | $10^8$<    | 150 | 500<  | 4.2 |
| 12 | 2.0 | $10^9$<    | 145 | 500<  | 4.5 |
| 13 | 1.4 | $10^{10}$< | 200 | 1000< | 4.9 |
| 14 | 1.4 | —          | 210 | 1000< | — |
| 15 | 1.5 | —          | 200 | 1000< | — |
| 16 | 2.4 | $10^9$<    | 165 | 500<  | 4.3 |
| 17 | 2.4 | $10^8$<    | 165 | 500<  | 4.4 |
| 18 | 2.5 | $10^8$<    | 155 | 300<  | 4.6 |
| 19 | 2.2 | $10^8$<    | 160 | 500<  | 4.5 |
| 20 | 2.3 | $10^8$<    | 160 | 500<  | 4.4 |
| 21 | 1.8 | $10^{10}$< | 215 | 500<  | 3.9 |
| 22 | 2.0 | $10^{10}$< | 195 | 1000< | 3.9 |
| 23 | 1.4 | $10^9$<    | 175 | 500<  | 4.0 |

Moreover, the evaluations of the peel strength, insulation resistance, glass transition temperature Tg, and heat cycle test and evaluation are described below.

(1) Peel Strength

It is measured according to JIS-C-6481.

(2) Insulation Resistance

A resist pattern is formed by forming an interlaminar insulating layer on the substrate, roughening the layer, applying a catalyst and then forming a plating resist. Thereafter, the electroless plating is conducted and an insulation resistance between patterns is measured. In this case, the value of insulation resistance between patterns in a comb-type pattern of L/S=75/75 $\mu$m is measured after 1000 hours at 80° C./85%/24V.

(3) Glass Transition Temperature Tg

It is measured by dynamic viscoelastic measurement.

(4) Heat Cycle Test

It is carried out at −65° C.×30 min to 125° C.×30 min, during which occurrence of cracks and peel of interlaminar insulating layer are measured. It is evaluated by durable cycle number.

EXAMPLE 24

Metallic Melamine Decorative Laminate

Although Examples 1–25 describe the embodiments of the printed circuit board, the invention is applied to a decorative laminate in this example.

(1) A melamine resin is impregnated in a paper-making sheet of woody pulp fibers having a basis weight of 10–80 g/m$^2$ and dried to form an impregnated paper having a thickness of 100 $\mu$m.

(2) 65 parts by weight of cresol-novolak type epoxy resin (made by Nippon Kayaku Co., Ltd. trade name: EOCN-104S, epoxy equivalent: 220, molecular weight: 5000), 40 parts by weight of polyether sulphone (PES)(made by ICI, trade name: Victrex, molecular weight: 17000), 5 parts by weight of imidazole type curing agent (made by Shikoku Kasei Co., Ltd. trade name: 2E4MZ-CN), 20 parts by weight of fine powder of calcium carbonate having an average particle size of 5.5 µm and 10 parts by weight of the same fine powder having an average particle size of 0.5 µm are mixed and added with a mixed solvent of dimethylformamide/butylcellosolve (1/1), during which the viscosity is adjusted to 120 cps in a homodisper agitating machine, and then kneaded through three rolls to obtain an adhesive solution. In this case, the viscosity at room temperature is 2–5 Pa·s.

(3) The adhesive obtained in the item (2) is applied onto a surface of a plywood, which is dried at 30° C. under vacuum and cured by heating at 80° C. for 2 hours, at 120° C. for 5 hours and at 150° C. for 2 hours to form an adhesive layer having a thickness of 20 µm.

(4) The adhesive layer is immersed in 6N hydrochloric acid at 70° C. for 15 minutes to roughen the surface of the adhesive layer, which is immersed in a neutral solution (made by Shipley) and washed with water to obtain an adhesive layer having Rmax=10±5 µm.

(5) A palladium catalyst (made by Shipley) is applied to the substrate provided with the roughened adhesive layer to activate the surface of the adhesive layer, which is subjected to an electroless silver plating according to usual manner to form a silver layer having a thickness of 60 µm on the surface.

(6) The melamine resin impregnated paper obtained in the item (1) is laminated on the surface of the silver layer as an overlay paper.

(7) A shaping plate having unevenness of 1–60 µm is laminated on the overlay paper and heat-pressed at 130–170° C. under a pressure of 30–80 kg/cm$^2$ to obtain a melamine decorative laminate having an embossed surface and a metallic gloss.

Since the melamine resin layer having a light transmissible and uneven surface is formed on the melamine decorative laminate, such an unevenness acts as a lens to floatably see the underground silver layer, whereby the silver gloss is attractive and the design becomes excellent.

Moreover, the cracking or peeling is not observed in the decorative laminate even after the heat cycle test of −65° C.×30 min to 125° C.×30 min.

When only the resin corresponding to the resin matrix of the adhesive used in this example is cured under the above condition, the resulting cured product contains resin particles having an average particle size of not more than 0.1 µm as measured by TEM likewise Example 1.

Furthermore, when the resin mixture containing no fine powder of calcium carbonate is cured, a peak of glass transition temperature Tg is one as measured by a viscoelastic test under conditions that vibration frequency is 6.28 rad/sec and temperature rising rate is 5° C./min.

Therefore, the resin matrix of the adhesive used in this example is considered to have quasi-homogeneous compatible structure.

EXAMPLE 25

Plated Coat Gear

This example is an application embodiment of the invention to a plated coat gear.

(1) A shaped body of gear is prepared by using a polyimide according to usual manner.

(2) An adhesive solution is obtained by mixing epoxy oligomer of cresol-novolak type epoxy resin in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), caprolacton modified trisisocyanurate (made by Toa Gosei Co., Ltd. trade name: Aronics M315) as a photosensitive monomer, benzophenone (BP) as a photoinitiator and Michlar ketone as a photosensitizer according to the following composition in DMDG, adding with 30 parts by weight of rubber filler (made by Japan Synthetic Rubber Co., Ltd.) having an average particle size of 5.0 µm, adjusting a viscosity to 1000 cps in a homodisper agitating machine with NMP, and then kneading through three rolls.

Resin composition: photosensitized epoxy/PES/M315/BP/imidazole=70/30/10/5/0.5/5

(3) The adhesive prepared in the item (2) is applied to the gear shaped body prepared in the item (1), which is dried at 25° C. under vacuum and cured through UV and heat-cured to form an adhesive layer comprised of resin matrix exhibiting quasi-homogeneous compatible structure.

(4) Then, the surface of the adhesive is roughened by immersing in an aqueous solution of chromic acid ($CrO_3$, 500 g/l) at 70° C. for 15 minutes, which is immersed in a neutral solution (made by Shipley) and wahsed with water. The roughened surface is Rmax=10 µm according to JIS-B-0601.

(5) A palladium catalyst (made by Shipley) is applied to the substrate provided with the roughened adhesive layer to activate the surface of the adhesive layer, which is subjected to nickel-phosphorus plating according to usual manner to produce a gear having a metallic gloss.

The thus obtained gear is strong to chemicals such as acid and the like and excellent in the abrasion resistance owing to rigid surface, so that there is not caused the peeling of nickel layer from surface in the use of the gear.

Further, there are caused no occurrence of crack in the adhesive layer and no peeling of nickel plated film through stress during the use of the gear.

When only the resin corresponding to the resin matrix of the adhesive used in this example is cured under the above condition, the resulting cured product contains resin particles having an average particle size of not more than 0.1 µm as measured by TEM likewise Example 1.

Furthermore, when the resin mixture containing no rubber filler is cured, a peak of glass transition temperature Tg is one as measured by a viscoelastic test under conditions that vibration frequency is 6.28 rad/sec and temperature rising rate is 5° C./min.

Therefore, the resin matrix of the adhesive used in this example is considered to have quasi-homogeneous compatible structure.

EXAMPLE 26

Heatsink-including Semiconductor Mounted Board

This example is an application embodiment of the invention to a heatsink-including semiconductor mounted board.

(1) An adhesive solution is obtained by mixing epoxy oligomer of cresol-novolak type epoxy resin in which 25% of epoxy group is acrylated to provide a photosensitivity (CNA 25, molecular weight: 4000), PES (molecular weight: 17000), an imidazole type curing agent (made by Shikoku Kasei Co., Ltd. trade name: 2E4MZ-CN), caprolacton modified trisisocyanurate (made by Toa Gosei Co., Ltd. trade name: Aronics M315) as a photosensitive monomer, benzophenone (BP) as a photoinitiator and Michlar ketone as a photosensitizer according to the following composition in DMDG, adding with 30 parts by weight of aluminum nitride powder having an average particle size of 5.0 μm, adjusting a viscosity to 1000 cps in a homodisper agitating machine with NMP, and then kneading through three rolls.

Resin composition: photosensitized epoxy/PES/M315/ BP/imidazole=70/30/10/5/0.5/5

(2) The adhesive solution of the item (1) is applied to a substrate for semiconductor mounted board comprising an aluminum base and a lead frame, which is dried at 25° C. under vacuum, cured through UV, heat-cured to form an adhesive layer comprised of a resin matrix exhibiting quasi-homogeneous compatible structure in which the aluminum base is covered with the adhesive layer and at the same time the aluminum base is integrally united with the lead frame.

(3) The semiconductor mounted board provided with the adhesive layer is immersed in water to dissolve and remove aluminum nitirde powder from the surface of the adhesive layer to thereby roughen the adhesive layer.

(4) A resist film for plating is attached, which is exposed to a light and developed to form a plating resist. Then, it is subjected to an electroless copper plating to form a conductor circuit on the surface and also conduct electrical connection to the lead frame through the conductor circuit.

(5) After an IC chip is mounted, a casing is formed by sealing with a resin through potting, whereby a heatsink including semiconductor mounted board is manufactured.

The thus produced heatsink including semiconductor mounted board is good in the heat dissipation because the heat conductivity of aluminum nitirde is high.

Furthermore, terminal function group in the resin matrix of this example is decomposed under conditions of high temperature, high humidity and high pressure to produce organic acids such as acetic acid, formic acid and the like, while aluminum nitride is decompsed while generating ammonia under the above conditions to neutralize the acids, so that the corrosion of metal adhered can be controlled.

When only the resin corresponding to the resin matrix of the adhesive used in this example is cured under the above condition, the resulting cured product contains resin particles having an average particle size of not more than 0.1 μm as measured by TEM likewise Example 1.

Furthermore, when the resin mixture containing no aluminum nitride powder is cured, a peak of glass transition temperature Tg is one as measured by a viscoelastic test under conditions that vibration frequency is 6.28 rad/sec and temperature rising rate is 5° C./min.

Therefore, the resin matrix of the adhesive used in this example is considered to have quasi-homogeneous compatible structure.

EXAMPLE 27

Electromagnetic Wave Interruption (EMI) Plated Shielding

This example is an embodiment of the invention to an electromagnetic wave interruption (EMI) plated shielding.

(1) 65 parts by weight of cresol-novolak type epoxy resin (made by Nippon Kayaku Co., Ltd. trade name: EOCN-104S, epoxy equivalent: 220, molecular weight: 5000), 40 parts by weight of polyether sulphone (PES)(made by ICI, trade name: Victrex, molecular weight: 17000), 5 parts by weight of imidazole type curing agent (made by Shikoku Kasei Co., Ltd. trade name: 2E4MZ-CN), 20 parts by weight of nickel fine powder having an average particle size of 5.5 μm and 10 parts by weight of the same powder having an average particle size of 0.5 μm are mixed and added with a mixed solvent of dimethylformamide/butylcellosolve (1/1), during which the viscosity is adjusted to 120 cps in a homodisper agitating machine, and then kneaded through three rolls to obtain an adhesive solution. In this case, the viscosity at room temperature is 2–5 Pa·s.

(2) The adhesive solution is applied onto a filter paper with a roller coater (made by Thermatronics Boeki Co., Ltd.), dried and cured by heating at 80C for 2 hours, at 120° C. for 5 hours and at 150° C. for 2 hours to form an adhesive layer having a thickness of about 20 μm.

(3) The filter paper provided with the adhesive layers is immersed in hydrochloric acid at 70° C. for 15 minutes to roughen the surface of the adhesive layer and then immersed in a neutral solution (made by Shipley) and washed with water. The roughened surface is Rmax=10 μm according to JIS-B-0601.

(4) A palladium catalyst (made by Shipley) is applied to the substrate having the roughened surface of the adhesive layer to activate the surface of the adhesive layer and subjected to a nickel plating according to usual manner.

The thus obtained electromagnetic wave interruption (EMI) plated shielding member is excellent in the shielding property because the adhesive itself contains nickel and the plated film has a shielding effect and also they have a multilayer structure.

Further, there is caused no crack in the adhesive layer even in the shielding member is bent, so that the work of the shielding member becomes easy.

When only the resin corresponding to the resin matrix of the adhesive used in this example is heat-cured under the above conditions, the resulting cured product contains resin particles having an average particle size of not more than 0.1 μm as measured by TEM likewise Example 1.

Furthermore, when the resin mixture containing no nickel fine powder is cured, a peak of glass transition temperature Tg is one as measured by a viscoelastic test under conditions that vibration frequency is 6.28 rad/sec and temperature rising rate is 5° C./min.

Therefore, it is considered that the resin matrix of the adhesive used in this example shows a quasi-homogeneous compatible structure.

EXAMPLE 28

Screw (1) A polycarbonate is shaped into a screw-shaped substrate.

(2) 65 parts by weight of cresol-novolak type epoxy resin (made by Nippon Kayaku Co., Ltd. trade name: EOCN-104S, epoxy equivalent: 220, molecular weight: 5000), 40 parts by weight of polyether sulphone (PES)(made by ICI, trade name: Victrex, molecular weight: 17000), 5 parts by weight of imidazole type curing agent (made by Shikoku Kasei Co., Ltd. trade name: 2E4MZ-CN), 20 parts by weight of vinyl chloride resin powder having an average particle size of 5.5 μm and 10 parts by weight of the same powder having an average particle size of 0.5 μm are mixed, stirred in a homodisper agitating machine, and then kneaded through three rolls to obtain an adhesive solution.

(3) The screw-shaped substrate of the item (1) is immersed the above adhesive solution and then dried and cured by heating at 80° C. for 2 hours, at 120° C. for 5 hours and at 150° C. for 2 hours to form an adhesive layer having a thickness of 20 μm. The cured adhesive layer has a spherical domain structure as observed by SEM after the broken surface is etched with methylene chloride.

(4) Then, vinyl chloride resin powder on the surface of the adhesive layer is dissolved and removed by immersing in acetone to roughen the surface of the adhesive layer.

(5) A palladium catalyst (made by Shipley) is applied onto the surface of the adhesive layer to activate the surface of the adhesive layer, which is then subjected to an electroless silver plating according to usual manner to produce a screw.

The thus obtained screw contains silver in its surface, so that algae and the like hardly adhere thereto owing to the sterilizing action of silver. Further, since the substrate is a one-piece body of polycarbonate, the breakage is hardly caused through centrifugal force during revolution.

The conventional screw is cut out from a metal ingot by cutting, so that the cost is piled up. On the contrary, the screw of this example is formed by one-piece molding of the resin, so that the cost can be decreased.

Moreover, there is caused no crack due to strain in the revolution because the adhesive layer has a toughness.

As mentioned above, according to the invention, the resin composite of quasi-homogeneous compatible structure, co-continuous phase structure or spherical domain structure formed by composing the thermosetting resin or photosensitive resin with the thermoplastic resin is used as a heat-resistant resin matrix of an adhesive, whereby the resin matrix can be strengthened to considerably improve the adhesion property between the adhesive layer and the coated metal without lowering the heat resistance, electric insulating property and chemical stability.

Thus, various metal film coated bodies such as printed circuit boards having an excellent peel strength and other industrial parts can stably be provided even in the wiring having higher density and higher pattern accuracy.

Namely, the invention is applicable to not only the printed circuit board but also various metal film adhered structural members and parts such as disk brake body, clutch hub, fuel jetting nozzle, fuel transporting pipe, gear and the like in the field of automobile industry; lead frame, hermetic seal, ceramic package, connector, condenser, resistor, solar electrode, hard disk and the like in the field of electric and electron industry; pump, valve, heat exchanger, filter, screw, dies and bearing in the field of industrial machines; and building materials such as decorative boards and so on, and is advantageous in industry.

What is claimed is:

1. A metal film adhered body comprising a substrate, an adhesive layer formed thereon, said adhesive layer having a roughened surface, and a metal film arranged on the adhesive layer, wherein the adhesive layer is formed by dispersing a removable particulate substance into a cured heat-resistant resin matrix comprised of a resin composite comprising a thermoplastic resin and at least one resin selected from a thermosetting resin and a photosensitive resin, wherein said particulate substance is at least one of dissolution-removable or decomposition-removable, and wherein said matrix comprises 15 to 50 wt. % of said thermoplastic resin, and wherein said dissolution-removable particulate substance is at least one selected from the group consisting of metal particles, resin particles soluble in alkali and resin particles soluble in an organic solvent, and wherein said decomposition-removable particulate is emulsion-polymerized amino resin having a low cross-linking degree comprising melamine resin, urea resin and guanamine resin, wherein said thermosetting resin comprises at least one functional group substituted by a photosensitive group.

2. A metal film adhered body according to claim 1, wherein said resin composite of the thermosetting resin or photosensitive resin and the thermoplastic resin forms a quasi-homogeneous compatible structure, co-continuous phase structure or spherical domain structure.

3. An adhesive layer formed on a substrate and having a roughened surface, wherein said layer is formed by dispersing a decomposition-removable granular substance into a cured heat-resistant resin matrix comprised of a resin composite comprising a thermoplastic resin and at least one resin selected from a thermosetting resin and a photosensitive resin, wherein said matrix comprises 15 to 50 wt. % of said thermoplastic resin, and wherein said decomposition-removable granular substance is emulsion-polymerized amino resin having a low cross-linking degree comprising melamine resin, urea resin and guanamine resin, wherein said thermosetting resin comprises at least one functional group substituted by a photosensitive group.

4. An adhesive layer according to claim 3, wherein said resin composite of the thermosetting resin or photosensitive resin and the thermoplastic resin forms a quasi-homogeneous compatible structure, co-continuous phase structure or spherical domain structure.

5. An adhesive layer formed on a substrate and having a roughened surface, wherein said layer is formed by dispersing one dissolution-removable granular substance selected from metal particles, resin particles soluble in an alkali and resin particles soluble in an organic solvent, into a cured heat-resistant resin matrix comprised of a resin composite comprising a thermoplastic resin and at least one resin selected from a thermosetting resin and a photosensitive resin, wherein said matrix comprises 15 to 50 wt. % of said thermoplastic resin, and wherein said thermosetting resin has at least one functional group substituted by a photosensitive group.

6. An adhesive layer according to claim 5, wherein said resin composite of the thermosetting resin or photosensitive resin and the thermoplastic resin forms a quasi-homogeneous compatible structure, co-continuous phase structure or spherical domain structure.

7. An adhesive layer formed on a substrate and having a roughened surface, wherein said layer is formed by dispersing a dissolution-removable resin into a cured heat-resistant resin matrix being a resin composite comprising a thermoplastic resin and at least one resin selected from a thermosetting resin and a photosensitive resin in the form of lands to form a sea-land structure, wherein said matrix comprises 15 to 50 wt. % of said thermoplastic resin, and wherein said dissolution-removable resin is at least one selected from the group consisting of metal particles, resin particles soluble in alkali and resin particles soluble in an organic solvent, and wherein said thermosetting resin has at least one functional group substituted by a photosensitive group.

8. An adhesive layer according to claim 7, wherein said resin composite of the thermosetting resin or photosensitive resin and the thermoplastic resin forms a quasi-homogeneous compatible structure, co-continuous phase structure or spherical domain structure.

9. An adhesive obtained by dispersing a decomposition-removable particulate substance into an uncured heat-resistant resin matrix, in which the heat-resistant resin matrix comprises a resin mixture comprising a thermoplastic resin and at least one resin selected from a thermosetting resin and a photosensitive resin, wherein said matrix comprises 15 to 50 wt. % of said thermoplastic resin, and wherein said decomposition-removable particulate substance is emulsion-polymerized amino resin having a low cross-linking degree comprising melamine resin, urea resin and guanamine resin, wherein said thermosetting resin has at least one functional group substituted by a photosensitive group.

10. An adhesive obtained by dispersing at least one dissolution-removable granular substance selected from the group consisting of metal particles, resin particles soluble in an alkali and resin particles soluble in an organic solvent into an uncured heat-resistant resin matrix, in which the heat-resistant resin matrix is a resin mixture comprising a thermoplastic resin and at least one resin selected from a thermosetting resin and a photosensitive resin, wherein said matrix comprises 15 to 50 wt. % of said thermoplastic resin, and wherein said thermosetting resin has at least one functional group substituted by a photosensitive group.

11. An adhesive obtained by dispersing into an uncured heat-resistant resin matrix a resin solution not miscible with the matrix before curing and dissolution removable after curing, wherein the heat-resistant resin matrix comprises a resin mixture of a thermoplastic resin and at least one resin selected from a thermosetting resin and a photosensitive resin, wherein said matrix comprises 15 to 50 wt. % of said thermoplastic resin, and wherein said resin solution comprises epoxy group terminal silicon resin solution, and wherein said thermosetting resin has at least one functional group substituted by a photosensitive group.

* * * * *

UNITED STATES PATENT AND TRADEMARK OFFICE
CERTIFICATE OF CORRECTION

PATENT NO.    : 6,607,825 B1
DATED         : August 19, 2003
INVENTOR(S)   : D. D. Wang et al.

It is certified that error appears in the above-identified patent and that said Letters Patent is hereby corrected as shown below:

Title page,
Item [54], title "METAL FILM BONDED BODY, BONDING AGENT LAYER AND BONDING AGENT" should read -- METAL FILM COATED BODY, ADHESIVE LAYER AND ADHESIVE --.

Signed and Sealed this

Twenty-seventh Day of April, 2004

JON W. DUDAS
*Acting Director of the United States Patent and Trademark Office*